United States Patent
Nagata et al.

(10) Patent No.: US 12,346,018 B2
(45) Date of Patent: Jul. 1, 2025

(54) REFLECTIVE MASK BLANK, REFLECTIVE MASK, METHOD OF MANUFACTURING REFLECTIVE MASK BLANK, AND METHOD OF MANUFACTURING REFLECTIVE MASK

(71) Applicant: AGC Inc., Tokyo (JP)

(72) Inventors: Yuya Nagata, Tokyo (JP); Daijiro Akagi, Tokyo (JP); Kenichi Sasaki, Tokyo (JP); Hiroaki Iwaoka, Tokyo (JP)

(73) Assignee: AGC Inc., Tokyo (JP)

( * ) Notice: Subject to any disclaimer, the term of this patent is extended or adjusted under 35 U.S.C. 154(b) by 0 days.

(21) Appl. No.: 18/649,410

(22) Filed: Apr. 29, 2024

(65) Prior Publication Data

US 2024/0295807 A1    Sep. 5, 2024

Related U.S. Application Data

(63) Continuation of application No. 18/517,796, filed on Nov. 22, 2023, now Pat. No. 12,001,134, which is a continuation of application No. PCT/JP2023/023323, filed on Jun. 23, 2023.

(30) Foreign Application Priority Data

Jul. 5, 2022  (JP) ................................ 2022-108642
Nov. 9, 2022  (JP) ................................ 2022-179622

(51) Int. Cl.
| | | |
|---|---|---|
| G03F 1/24 | (2012.01) | |
| G03F 1/26 | (2012.01) | |
| G03F 1/52 | (2012.01) | |
| G03F 1/80 | (2012.01) | |

(52) U.S. Cl.
CPC ................. *G03F 1/24* (2013.01); *G03F 1/26* (2013.01); *G03F 1/52* (2013.01); *G03F 1/80* (2013.01)

(58) Field of Classification Search
CPC ..................................... G03F 1/24; G03F 1/26
USPC ............................................................ 430/5
See application file for complete search history.

(56) References Cited

U.S. PATENT DOCUMENTS

| | | | |
|---|---|---|---|
| 11,914,284 B2 | 2/2024 | Akagi et al. | |
| 2002/0027974 A1 | 3/2002 | Ezaki et al. | |
| 2017/0038673 A1 | 2/2017 | Ikebe et al. | |
| 2018/0329285 A1 | 11/2018 | Hamamoto et al. | |
| 2019/0384158 A1 | 12/2019 | Ikebe et al. | |
| 2021/0208498 A1 | 7/2021 | Ikebe et al. | |
| 2021/0341828 A1 | 11/2021 | Liu et al. | |
| 2022/0035234 A1 | 2/2022 | Akagi et al. | |
| 2022/0107556 A1 | 4/2022 | Liu et al. | |
| 2022/0299862 A1 | 9/2022 | Akagi et al. | |
| 2022/0390826 A1 | 12/2022 | Ikebe et al. | |
| 2023/0076438 A1 | 3/2023 | Fukasawa et al. | |
| 2023/0251564 A1 | 8/2023 | Taki et al. | |
| 2023/0288794 A1 | 9/2023 | Akagi et al. | |
| 2023/0324785 A1 | 10/2023 | Kawahara et al. | |
| 2023/0333459 A1 | 10/2023 | Ikebe | |
| 2023/0418148 A1 | 12/2023 | Fukasawa et al. | |
| 2024/0045319 A1 | 2/2024 | Akagi et al. | |
| 2024/0094622 A1 | 3/2024 | Nagata et al. | |

FOREIGN PATENT DOCUMENTS

| | | |
|---|---|---|
| JP | 2015-122468 A | 7/2015 |
| JP | 2015-142083 A | 8/2015 |
| JP | 2016-122684 A | 7/2016 |
| JP | 2018-146945 | 9/2018 |
| JP | 2021-81644 A | 5/2021 |
| JP | 2021-101258 A | 7/2021 |
| JP | 2021-128247 | 9/2021 |
| JP | 6929983 B1 | 9/2021 |
| JP | 2022-024617 | 2/2022 |
| KR | 10-2014-0066563 A | 6/2014 |
| WO | WO 2019/225736 A1 | 11/2019 |
| WO | WO 2021/132111 A1 | 7/2021 |
| WO | WO 2022/065421 A1 | 3/2022 |
| WO | WO 2022/118762 A1 | 6/2022 |
| WO | WO 2022/138170 | 6/2022 |
| WO | WO 2022/138360 | 6/2022 |
| WO | WO 2022/138434 A1 | 6/2022 |

(Continued)

OTHER PUBLICATIONS

Japanese Decision to Grant issued Dec. 5, 2023 in Japanese Patent Application No. 2023-551682 (with English Translation), 5 pages.

(Continued)

*Primary Examiner* — Christopher G Young
(74) *Attorney, Agent, or Firm* — Oblon, McClelland, Maier & Neustadt, L.L.P.

(57) ABSTRACT

A reflective mask blank includes a substrate; a multilayer reflective film that reflects EUV light; a protection film that protects the multilayer reflective film; and a phase shift film that shifts a phase of the EUV light. The phase shift film contains Ir as a main component. A ratio of a maximum value of an intensity of a peak of diffracted light from the phase shift film in a 2θ range of 35° to 45° to an average value of an intensity of the diffracted light in a 2θ range of 55° to 60° measured using an XRD method with a CuKα ray, upon being irradiated with the EUV light with an incident angle of θ, is 1.0 or more and 30 or less. A refractive index and an extinction coefficient of the phase shift film to the EUV light are 0.925 or less, and 0.030 or more, respectively.

18 Claims, 12 Drawing Sheets

(56) References Cited

FOREIGN PATENT DOCUMENTS

WO     WO 2023/095769     6/2023

OTHER PUBLICATIONS

International Search Report issued Aug. 29, 2023 in PCT/JP2023/023537, 2 pages.
Japanese Office Action issued Sep. 19, 2023 in Japanese Patent Application No. 2023-551682 (with English Translation), 11 pages.
United States Office Action issued May 3, 2024 in U.S. Appl. No. 18/420,846, 17 pages.
Wagner et al., "Handbook of X-Ray Photoelectron Spectroscopy", Perkin-Elmer Corporation, 1979, 193 pages.

REFLECTIVE MASK BLANK, REFLECTIVE MASK, METHOD OF MANUFACTURING REFLECTIVE MASK BLANK, AND METHOD OF MANUFACTURING REFLECTIVE MASK

CROSS-REFERENCE TO RELATED APPLICATION

The present application is a continuation application of U.S. application Ser. No. 18/517,796, filed on Nov. 22, 2023, which is a continuation application of International Application No. PCT/JP2023/023323, filed Jun. 23, 2023, which claims priority to Japanese Patent Applications No. 2022-108642 filed Jul. 5, 2022, and No. 2022-179622 filed Nov. 9, 2022. The contents of these applications are incorporated herein by reference in their entirety.

BACKGROUND OF THE INVENTION

1. Field of the Invention

The disclosure herein generally relates to a reflective mask blank, a reflective mask, a method of manufacturing a reflective mask blank, and a method of manufacturing a reflective mask.

2. Description of the Related Art

Along with the recent miniaturization of semiconductor devices, EUV lithography (EUVL), an exposure technology using Extreme Ultra-Violet (EUV) light, has been developed. The EUV light includes a soft X-ray and a vacuum ultraviolet light, and specifically has a wavelength of 0.2 nm-100 nm. At present, EUV light with a wavelength of about 13.5 nm is mainly studied.

In the EUVL, a reflective mask is used. The reflective mask includes a substrate, such as a glass substrate, a multilayer reflective film that reflects EUV light, and a phase shift film that shifts a phase of the EUV light, in this order. An opening pattern is formed in the phase shift film. In the EUVL, the opening pattern of the phase shift film is transferred to a target substrate, such as a semiconductor substrate. The transferring includes transferring a reduced opening pattern.

The phase shift film of Japanese Unexamined Patent Application Publication No. 2018-146945 is made of an alloy containing an element selected from Group A and an element selected from Group B in order to suppress a variation in a phase difference due to a variation in a film thickness of the phase shift film. Group A consists of Pd, Ag, Pt, Au, Ir, W, Cr, Mn, Sn, Ta, V, Fe, and Hf. Group B consists of Rh, Ru, Mo, Nb, Zr, and Y.

The phase shift film of Japanese Unexamined Patent Application Publication No. 2021-128247 has an uppermost layer and a lower layer other than the uppermost layer. The uppermost layer contains at least one metal element selected from Rh, Pd, Ag, Pt, Ru, Au, Ir, Co, Sn, Ni, Re, Mo, and Nb, and further contains hydrogen or deuterium. The uppermost layer has a microcrystalline structure or an amorphous structure by containing hydrogen or deuterium.

SUMMARY OF THE INVENTION

Problems to be Solved by the Invention

As the phase shift film, one made of an Ir-based material can be considered. The Ir-based material is a material containing Ir as a main component. Iridium (Ir) has a small refractive index for EUV light and a large extinction coefficient for EUV light. Therefore, by using the Ir-based material as the material of the phase shift film, the phase shift film can be made thin while ensuring a desired phase difference.

However, when Ir is used alone, there is a problem that Ir is easily crystallized. As the size of the crystal increases, a roughness of the side wall of the opening pattern increases. This is because when the opening pattern is formed, an etching is liable to proceed along a grain boundary of crystals.

Japanese Unexamined Patent Application Publication No. 2018-146945 describes that the phase shift film contains Ir, but does not describe crystallization of Ir. When Ir is alloyed with Nb, Zr, or Y, there is a possibility that the crystallization of Ir can be suppressed, but the optical properties (refractive index and extinction coefficient) of the phase shift film are deteriorated.

Japanese Unexamined Patent Application Publication No. 2021-128247 describes that the phase shift film contains Ir, but does not describe experimental data of the phase shift film containing Ir. According to the findings of the present inventors, Ir does not readily bond to hydrogen or deuterium, and it is difficult to suppress crystallization of Ir by using hydrogen or deuterium.

An aspect of the present disclosure provides a technique for suppressing a crystallization of a phase shift film while suppressing deterioration of optical properties of the phase shift film when the phase shift film contains Ir as a main component.

Means for Solving the Problem

According to an aspect of the present disclosure, a reflective mask blank includes a substrate; a multilayer reflective film that reflects EUV light; a protection film that protects the multilayer reflective film; and a phase shift film that shifts a phase of the EUV light, arranged in this order. The phase shift film contains Ir as a main component. A ratio (Ip/Ia) of a maximum value Ip of an intensity of a peak of diffracted light from the phase shift film in a range of 2θ of 35 degrees to 45 degrees to an average value Ia of an intensity of the diffracted light in a range of 2θ of 55 degrees to 60 degrees measured using an XRD method with a CuKα ray, upon the phase shift film being irradiated with the EUV light with an incident angle of θ, is 1.0 or more and 30 or less. A refractive index n of the phase shift film to the EUV light is 0.925 or less. An extinction coefficient k of the phase shift film to the EUV light is 0.030 or more.

Effects of the Invention

According to an aspect of the present disclosure, when the phase shift film contains Ir as a main component, it is possible to suppress the crystallization of the phase shift film while suppressing deterioration of the optical properties of the phase shift film.

BRIEF DESCRIPTION OF THE DRAWINGS

Other objects and further features of the present disclosure will be apparent from the following detailed description when read in conjunction with the accompanying drawings, in which.

DESCRIPTION OF THE EMBODIMENT

Figure 1:
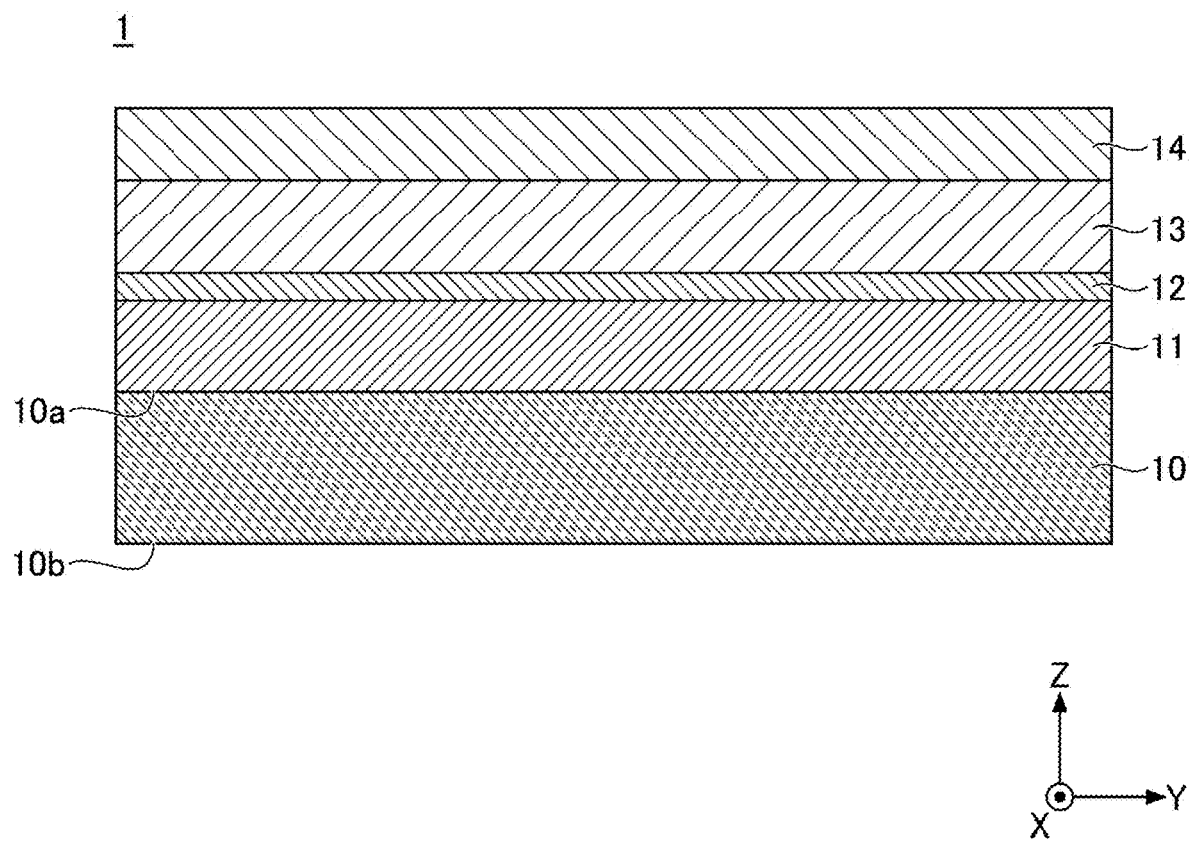
FIG. 1 is a cross-sectional view showing a reflective mask blank according to an embodiment.

In the following, embodiments of the present disclosure will be described with reference to the accompanying drawings. In each drawing, to the same or corresponding configurations, the same reference numeral will be assigned, and an explanation may be omitted. In the specification, a symbol "-" representing a numerical range indicates that values before and after the symbol are included as a lower limit value and an upper limit value, respectively.

Figure 2:
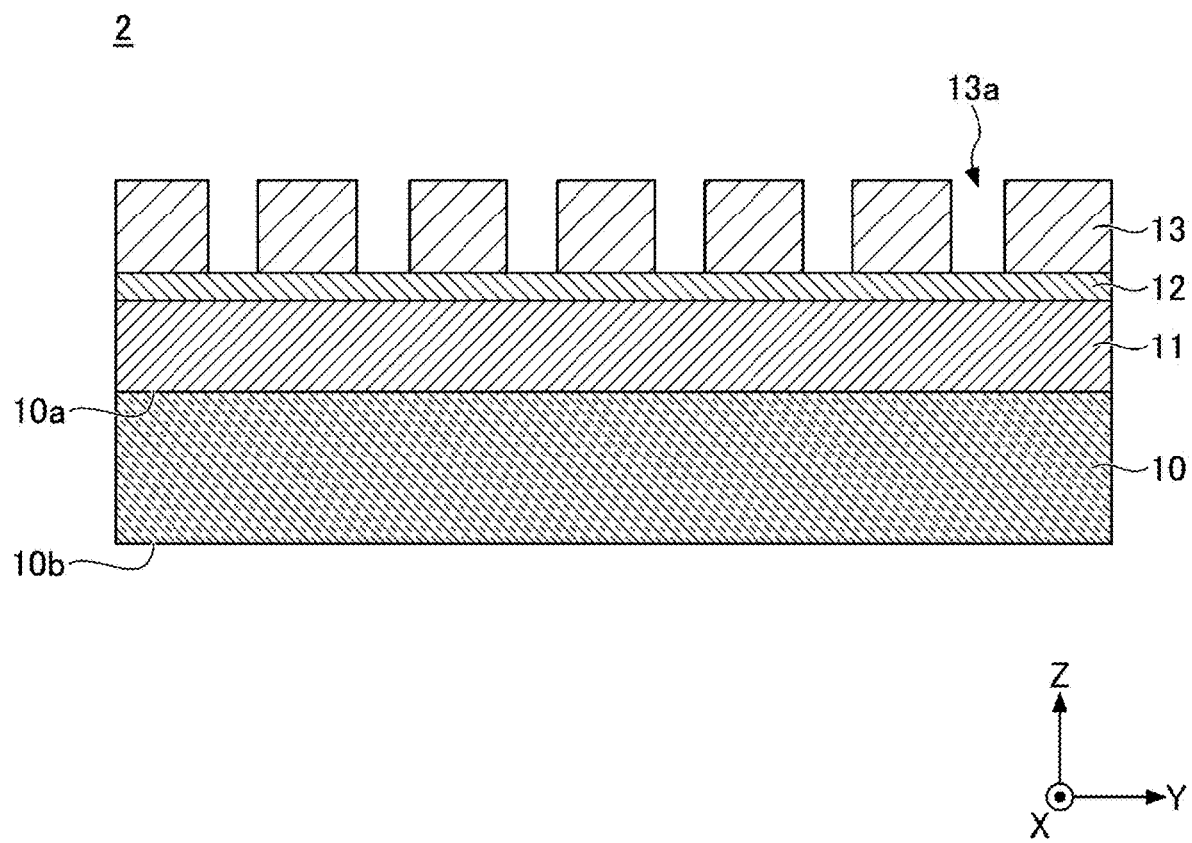
FIG. 2 is a cross-sectional view showing a reflective mask according to the embodiment.
Figure 3:
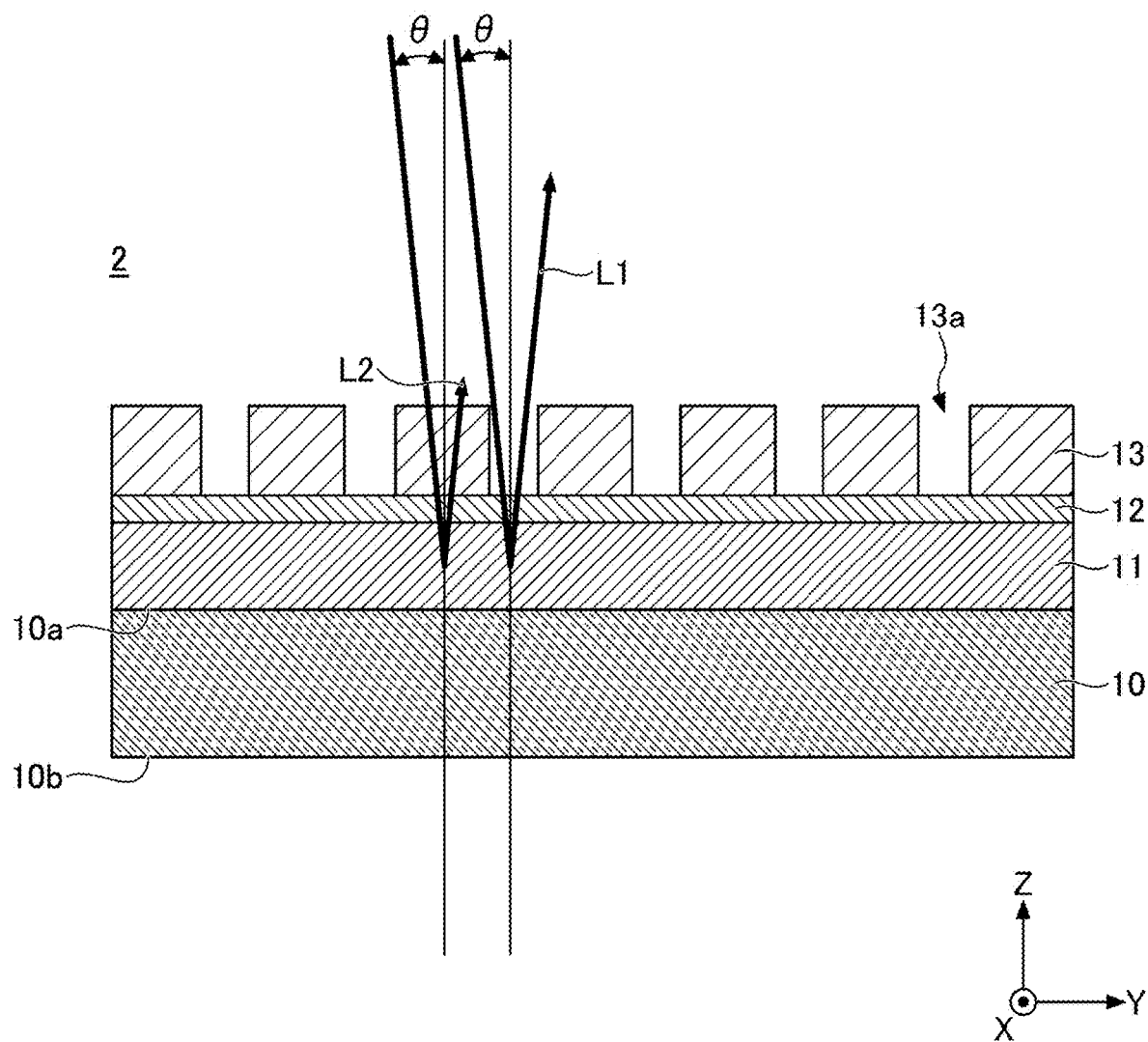
FIG. 3 is a cross-sectional view of the reflective mask for illustrating an example of EUV light reflected by the reflective mask of FIG. 2.

In FIGS. 1 to 3, an X-axis direction, a Y-axis direction, and a Z-axis direction are directions orthogonal to each other. The Z-axis direction is a direction perpendicular to a first main surface 10*a* of a substrate 10. The X-axis direction is a direction perpendicular to an incident plane of EUV light (a plane including an incident light beam and a reflected light beam). As shown in FIG. 3, when viewed from the X-axis direction, the incident light beam is inclined towards the Y-axis positive direction on propagating in the Z-axis negative direction, and the reflected light beam is inclined towards the Y-axis positive direction on propagating in the Z-axis positive direction.

A reflective mask blank 1 according to an embodiment will be described with reference to FIG. 1. The reflective mask blank 1 includes, for example, the substrate 10; a multilayer reflective film 11; a protection film 12; a phase shift film 13; and an etching mask film 14, in this order. The multilayer reflective film 11, the protection film 12, the phase shift film 13, and the etching mask film 14 are formed in this order on the first main surface 10*a* of the substrate 10. The reflective mask blank 1 only needs to have at least the substrate 10, the multilayer reflective film 11, the protection film 12, and the phase shift film 13.

The reflective mask blank 1 may further have a functional film, which is not shown in FIG. 1. For example, the reflective mask blank 1 may have a conductive film on the side opposite to the multilayer reflective film 11 with respect to the substrate 10. The conductive film is formed on a second main surface 10*b* of the substrate 10. The second main surface 10*b* is a surface opposite to the first main surface 10*a*. The conductive film may be used, for example, to attract a reflective mask 2 to an electrostatic chuck of an exposure apparatus.

Although not shown, the reflective mask blank 1 may have a buffer film between the protection film 12 and the phase shift film 13. The buffer film protects the protection film 12 from an etching gas for forming an opening pattern 13*a* in the phase shift film 13. The buffer film is etched more moderately than the phase shift film 13. Different from the protection film 12, the buffer film ultimately has the same opening pattern as the opening pattern 13*a* of the phase shift film 13.

Next, the reflective mask 2 according to the embodiment will be described with reference to FIGS. 2 and 3. The reflective mask 2 is manufactured using, for example, the reflective mask blank 1 shown in FIG. 1, and includes the opening pattern 13*a* in the phase shift film 13. The etching mask film 14 shown in FIG. 1 is removed after the opening pattern 13*a* is formed in the phase shift film 13.

In EUVL, the opening pattern 13*a* of the phase shift film 13 is transferred to a target substrate, such as a semiconductor substrate. The transferring includes transferring a reduced opening pattern. In the following, the substrate 10, the multilayer reflective film 11, the protection film 12, the phase shift film 13, and the etching mask film 14 will be described in this order.

The substrate 10 is, for example, a glass substrate. A material of the substrate 10 is preferably quartz glass containing $TiO_2$. Compared with general soda lime glass, a linear expansion coefficient of the quartz glass is small, and thereby a dimensional change due to a temperature change is small. The quartz glass may contain 80 mass %-95 mass % of $SiO_2$ and 4 mass %-17 mass % of $TiO_2$. When the $TiO_2$ content is 4 mass %-17 mass %, the linear expansion coefficient around room temperature is substantially zero, and almost no dimensional change around room temperature occurs. The quartz glass may contain a third component or impurity other than $SiO_2$ and $TiO_2$. The material of the substrate 10 may be crystallized glass in which a β-quartz solid solution is precipitated, silicon, metal, or the like.

The substrate 10 has the first main surface 10*a* and a second main surface 10*b* opposite to the first main surface 10*a*. The multilayer reflective film 11 and the like are formed on the first main surface 10*a*. The size of the substrate 10 in a plan view (viewed in the Z-axis direction) is, for example, 152 mm longitudinally and 152 mm laterally. The longitudinal and lateral dimensions may be greater than or equal to 152 mm. Each of the first main surface 10*a* and the second main surface 10*b* has, for example, a square-shaped quality-guaranteed region at the center thereof. The size of the quality-guaranteed region is, for example, 142 mm longitudinally and 142 mm laterally. The quality-guaranteed region on the first main surface 10*a* preferably has a root mean square roughness (Rq) of 0.150 nm or less and a flatness of 100 nm or less. The quality-guaranteed region of the first main surface 10*a* is preferably free from a defect that may cause a phase defect.

The multilayer reflective film 11 reflects EUV light. The multilayer reflective film 11 is formed by alternately stacking, for example, a high refractive index layer and a low refractive index layer. A material of the high refractive index layer is, for example, silicon (Si), and a material of the low refractive index layer is, for example, molybdenum (Mo). With this combination, the multilayer reflective film is a Mo/Si multilayer reflective film. In addition, a Ru/Si multilayer reflective film, a Mo/Be multilayer reflective film, a Mo compound/Si compound multilayer reflective film, a Si/Mo/Ru multilayer reflective film, a Si/Mo/Ru/Mo multilayer reflective film, a Si/Ru/Mo/Ru multilayer reflective film, a MoRu/Si multilayer reflective film, a Si/Ru/Mo multilayer reflection film, or the like can also be used as the multilayer reflective film 11.

The film thickness of each layer constituting the multilayer reflective film 11 and the number of repeating units of layers can be appropriately selected according to the material of each layer and a reflectance to EUV light. When the multilayer reflective film 11 is a Mo/Si multilayer reflective film, in order to achieve a reflectance of 60%, or more with respect to EUV light having an incident angle θ (see FIG. 3) of 6°, a Mo film having a film thickness of 2.3±0.1 nm and a Si film having a film thickness of 4.5±0.1 nm may be stacked so that the number of repeating units is 30 or more and 60 or less. The multilayer reflective film 11 preferably has the reflectance of 60% or more to EUV light at an incident angle θ of 6°. The reflectance is more preferably 65% or more.

The method of forming each layer constituting the multilayer reflective film 11 is, for example, a DC sputtering method, a magnetron sputtering method, or an ion beam sputtering method. For example, film formation conditions for each of the Mo film and the Si film, when a Mo/Si multilayer reflective film is formed by the ion beam sputtering method, will be shown as follows.
<Film Formation Conditions for Si Film>
  Target: Si;
  Sputtering gas: Ar;
  Gas pressure: 0.013 Pa-0.027 Pa;
  Ion acceleration voltage: 300 V-1500 V;
  Film formation rate: 0.030 nm/sec-0.300 nm/sec; and
  Film thickness of Si film: 4.5±0.1 nm.
<Film Formation Conditions for Mo Film>
  Target: Mo;
  Sputtering gas: Ar;
  Gas pressure: 0.013 Pa-0.027 Pa;
  Ion acceleration voltage: 300 V-1500 V;
  Film formation rate: 0.030 nm/sec-0.300 nm/sec; and
  Film Thickness of Mo Film: 2.3±0.1 nm
<Repeating Unit of Si Film and Mo Film>
  Number of repeating units: 30-60 (preferably 40-50).

The protection film 12 is formed between the multilayer reflective film 11 and the phase shift film 13, to protect the multilayer reflective film 11. The protection film 12 protects the multilayer reflective film 11 from an etching gas used for forming the opening pattern 13a (see FIG. 2) in the phase shift film 13. The protection film 12 is not removed even when exposed to the etching gas, and remains on the multilayer reflective film 11.

The etching gas is, for example, a halogen-based gas, an oxygen-based gas, or a mixture gas thereof. The halogen-based gas includes a chlorine-based gas and a fluorine-based gas. The chlorine-based gas is, for example, a $Cl_2$ gas, a $SiCl_4$ gas, a $CHCl_3$ gas, a $CCl_4$ gas, a $BCl_3$ gas, or a mixture gas thereof. The fluorine-based gas is, for example, a $CF_4$ gas, a $CHF_3$ gas, a $SF_6$ gas, a $BF_3$ gas, a $XeF_2$ gas or a mixture gas thereof. The oxygen-based gas is an $O_2$ gas, an $O_3$ gas or a mixture gas thereof.

A ratio (ER2/ER1) of an etching rate ER2 of the phase shift film 13 to an etching rate ER1 of the protection film 12 is also referred to as a selection ratio (ER2/ER1). The higher the selection ratio (ER2/ER1) is, the better the processability of the phase shift film 13 is. The selection ratio (ER2/ER1) is preferably 5.0 or more, more preferably 10 or more, and even more preferably 30 or more. The selection ratio (ER2/ER1) is preferably 200 or less, and more preferably 100 or less.

The protection film 12 contains at least one element selected from, for example, ruthenium (Ru), rhodium (Rh), and silicon (Si). When the protection film 12 contains Rh, the protection film may contain only Rh, but the protection film preferably contains a Rh compound. The Rh compound may contain, in addition to Rh, at least one element Z1 selected from the group consisting of Ru, Nb, Mo, Ta, Ir, Pd, Zr, Y, and Ti.

By adding Ru, Nb, Mo, Zr, Y, or Ti to Rh, an extinction coefficient k can be reduced while suppressing an increase of the refractive index n, so that the reflectance for EUV light can be improved. In addition, by adding Ru, Ta, Ir, Pd, or Y to Rh, resistance to the etching gas or/and resistance to a sulfuric acid/hydrogen peroxide can be improved. A sulfuric acid/hydrogen peroxide is used for removing a resist film, which will be described later, or for cleaning the reflective mask 2, and the like.

An element ratio between the element Z1 (all Z1) and rhodium (Rh), Z1:Rh, is preferably 1:99-1:1. In the specification of the present application, the element ratio means a molar ratio. When the value of the ratio Z1/Rh is 1/99 or more, the reflectance for EUV light is excellent. When the value of the ratio Z1/Rh is less than or equal to 1, the resistance of the protection film 12 to the etching gas is excellent. The element ratio between Z1 and Rh, Z1:Rh, is more preferably 3:10-1:1.

The Rh compound may contain, in addition to rhodium (Rh), at least one element Z2 selected from the group consisting of nitrogen (N), oxygen (O), carbon (C), and boron (B). Although the element Z2 reduces the resistance of the protection film 12 to the etching gas, the element Z2 suppresses the crystallization of the protection film 12 and forms a smooth surface of the protection film 12. The Rh compound containing the element Z2 has a non-crystalline structure or a microcrystalline structure. When the Rh compound has a non-crystalline structure or a microcrystalline structure, the X-ray diffraction (XRD) profile of the Rh compound does not exhibit a clear peak.

When the Rh compound contains Z2 in addition to Rh, it is preferable that the content of Rh or the total content of Rh and Z1 is 40 at %-99 at %, and the total content of Z2 is 1 at %-60 at %. When the Rh compound contains Z2 in addition to Rh, it is more preferable that the content of Rh or the total content of Rh and Z1 is 80 at %-99 at %, and the total content of Z2 is 1.0 at %-20 at %.

When the Rh compound contains 90 at % or more of Rh, contains Z1, Z2, or both, and has a film density of 10.0 $g/cm^3$-14.0 $g/cm^3$, the Rh compound has a non-crystalline structure or a microcrystalline structure. The film density of the protection film 12 is preferably 11.0 $g/cm^3$-13.0 $g/cm^3$. When the protection film 12 contains 100 at % of Rh and has the film density of 11.0 $g/cm^3$-12.0 $g/cm^3$, the protection film 12 has a non-crystalline structure or a microcrystalline structure. The film density of the protection film 12 is measured using an X-ray reflectance method.

The protection film 12 is a single layer in the present embodiment, but may be a plurality of layers. That is, the protection film 12 may be a multilayer film having a lower layer and an upper layer. The lower layer of the protection film 12 is a layer formed in contact with the uppermost surface of the multilayer reflective film 11. The upper layer of the protection film 12 is formed in contact with the lowermost surface of the phase shift film 13. As described above, by forming the protection film 12 into a multi-layer structure, a material excellent in a predetermined function can be used for each layer, so that the entire protection film 12 can be made multifunctional. When the protection film 12 contains 50 at % or more of Rh as a whole, the protection film 12 may have a layer that does not contain Rh. In the following, when the protection film 12 is a multilayer film, the thickness of the protection film 12 indicates a total film thickness of the multilayer film.

The thickness of the protection film 12 is preferably 1.5 nm or more and 4.0 nm or less, and more preferably 2.0 nm or more and 3.5 nm or less. When the thickness of the protection film 12 is 1.5 nm or more, the etching resistance is good. In addition, when the thickness of the protection film 12 is 4.0 nm or less, a decrease in the reflectance with respect to EUV light can be suppressed.

A film density of the protection film 12 is preferably 10.0 g/cm$^3$ or more and 14.0 g/cm$^3$ or less. When the film density of the protection film 12 is 10.0 g/cm$^3$ or more, the etching resistance is good. In addition, when the film density of the protection film 12 is 14.0 g/cm$^3$ or less, it is possible to suppress a decrease in the reflectance with respect to EUV light.

A root mean square roughness (Rq) of the upper surface of the protection film 12, on which the phase shift film 13 is formed, is preferably 0.300 nm or less, and more preferably 0.150 nm or less. When the root mean square roughness (Rq) is 0.300 nm or less, the phase shift film 13 and the like can be smoothly formed on the protection film 12. In addition, scattering of the EUV light can be suppressed, and the reflectance with respect to the EUV light can be improved. The root mean square roughness (Rq) is preferably greater than or equal to 0.050 nm.

The method of forming the protection film 12 includes, for example, a DC sputtering method, a magnetron sputtering method, or an ion beam sputtering method. For example, film formation conditions, when a Rh film is formed by the DC sputtering method, will be shown as follows.

<Film Formation Conditions for Rh Film>
  Target: Rh;
  Sputtering gas: Ar;
  Gas pressure: $1.0 \times 10^{-2}$ Pa-$1.0 \times 10^{0}$ Pa;
  Power density of target: 1.0 W/cm$^2$-8.5 W/cm$^2$;
  Film formation rate: 0.020 nm/sec-1.000 nm/sec; and
  Film thickness of Rh film: 1 nm-10 nm.

When the Rh film is formed, a N$_2$ gas or a mixture gas of an Ar gas and a N$_2$ gas may be used as the sputtering gas. The volume ratio of a N$_2$ gas in the sputtering gas, N$_2$/(Ar+N$_2$), is 0.05 or more and 1.0 or less.

For example, film formation conditions, when a RhO film is formed by the DC sputtering method, will be shown as follows.

<Film Formation Conditions for Rho Film>
  Target: Rh;
  Sputtering gas: an O$_2$ gas, or a mixture gas of an Ar gas and an O$_2$ gas;
  Volume ratio of an O$_2$ gas in sputtering gas (O$_2$/(Ar+O$_2$)): 0.05-1.0;
  Gas pressure: $1.0 \times 10^{-2}$ Pa-$1.0 \times 10^{0}$ Pa;
  Power density of target: 1.0 W/cm$^2$-8.5 W/cm$^2$;
  Film formation rate: 0.020 nm/sec-1.000 nm/sec; and
  Film thickness of RhO film: 1 nm-10 nm.

For example, film formation conditions, when a RhRu film is formed by the DC sputtering method, will be shown as follows.

<Film Formation Conditions for RhRu Film>
  Target: Rh and Ru (or RhRu);
  Sputtering gas: Ar;
  Gas pressure: $1.0 \times 10^{-2}$ Pa-$1.0 \times 10^{0}$ Pa;
  Power density of target: 1.0 W/cm$^2$-8.5 W/cm$^2$;
  Film formation rate: 0.020 nm/sec-1.000 nm/sec; and
  Film thickness of RhRu film: 1 nm-10 nm.

The phase shift film 13 is a film in which the opening pattern 13$a$ is formed. The opening pattern 13$a$ is not formed in the manufacturing process of the reflective mask blank 1 but is formed in the manufacturing process of the reflective mask 2. The phase shift film 13 not only absorbs EUV light but also shifts a phase of the EUV light. The phase shift film 13 shifts a phase of second EUV light L2 with respect to a phase of first EUV light L1 shown in FIG. 3.

The first EUV light L1 is light that entered and passed through the opening pattern 13$a$ without passing through the phase shift film 13, was reflected by the multilayer reflective film 11, and passed through the opening pattern 13$a$ again without passing through the phase shift film 13 and exited. The second EUV light L2 is light that entered and passed through the phase shift film 13 while being absorbed by the phase shift film 13, was reflected by the multilayer reflective film 11, and passed through the phase shift film 13 while being absorbed again by the phase shift film 13 and exited.

The phase difference, which is greater than or equal to zero, between the first EUV light L1 and the second EUV light L2 is, for example, 170°-250°. A phase of the first EUV light L1 may be advanced or retarded from a phase of the second EUV light L2. The phase shift film 13 improves a contrast of a transferred image by utilizing an interference between the first EUV light L1 and the second EUV light L2. The transferred image is an image obtained by transferring the opening pattern 13$a$ of the phase shift film 13 to a target substrate.

In EUVL, the so-called shadowing effect occurs. The shadowing effect is caused by an incident angle θ of EUV light that is not 0° (e.g. 6°), which causes occurrence of a region near the side wall of the opening pattern 13$a$ that blocks the EUV light by the side wall, resulting in a positional displacement or dimensional displacement of the transferred image. To reduce the shadowing effect, lowering the height of the side wall of the opening pattern 13$a$ is effective, and thinning the phase shift film 13 is effective.

A film thickness of the phase shift film 13 is, for example, 60 nm or less, and preferably 50 nm or less, to reduce the shadowing effect. The film thickness of the phase shift film 13 is preferably 20 nm or more, and more preferably 30 nm or more, to ensure the phase difference between the first EUV light L1 and the second EUV light L2.

To reduce the film thickness of the phase shift film 13 to reduce the shadowing effect while ensuring the phase difference between the first EUV light L1 and the second EUV light L2, it is effective to reduce a refractive index n of the phase shift film 13. Therefore, the phase shift film 13 of the present embodiment is made of an Ir-based material. The Ir-based material is a material containing Ir as a main component, and is a material containing 50 at % to 100 at % of Ir. That is, the phase shift film 13 contains 50 at % to 100 at % of Ir.

The Ir-based material has a small refractive index n and a large extinction coefficient k. Therefore, the phase shift film 13 can be made thin while ensuring a desired phase difference. The larger the Ir content, the smaller the refractive index n and the larger the extinction coefficient k. The Ir content is preferably 70 at % or more, more preferably 80 at % or more.

The refractive index n of the phase shift film 13 is preferably 0.925 or less, more preferably 0.920 or less, still more preferably 0.918 or less, even more preferably 0.910 or less, and particularly preferably 0.900 or less. As the refractive index n of the phase shift film 13 becomes smaller, the phase shift film 13 can be made thinner. The refractive index n of the phase shift film 13 is preferably 0.885 or more. In this specification, the refraction index is a refraction index with respect to EUV light (for example, light having a wave length of 13.5 nm).

The extinction coefficient k of the phase shift film 13 is preferably 0.030 or more, more preferably 0.034 or more, still more preferably 0.036 or more, and particularly preferably 0.038 or more. As the extinction coefficient k of the phase shift film 13 is larger, it is easier to obtain a desired reflectance with a small film thickness. The extinction coefficient k of the phase shift film 13 is preferably 0.065 or less. In this specification, the extinction coefficient is an extinction coefficient with respect to EUV light (for example, light having a wavelength of 13.5 nm).

In the phase shift film 13, a ratio (Ip/Ia) of a maximum value Ip of a peak intensity of a diffracted light in a range of 2θ of 35° to 45° to an average value Ia of an intensity of the diffracted light (diffraction intensity) in the range of 2θ of 55° to 60° in an XRD method using a CuKα ray, upon the phase shift film being irradiated with EUV light with an incident angle of θ, is preferably 30 or less, more preferably 20 or less, and still more preferably 10 or less. As the XRD method, an out-of-plane method is used. Hereinafter, the ratio Ip/Ia will be also referred to as a peak intensity ratio. When the peak intensity ratio Ip/Ia is 30 or less, the crystallinity of the phase shift film 13 is low, and the roughness of the side wall of the opening pattern 13a can be reduced. Although the crystallinity decreases with smaller Ip/Ia ratio, the ratio Ip/Ia is preferably 1.0 or more, and more preferably 2.0 or more.

In the phase shift film 13, a full width at half maximum FWHM of a peak having the highest intensity in the range of 2θ of 35° to 60° in the XRD method using a CuKα ray is preferably 1.2° or more. As the XRD method, the out-of-plane method is used. The peak having the highest intensity in the range of 2θ of 35° to 60° appears in the range of 2θ of 35° to 45°. When the full width at half maximum FWHM is 1.2° or more, the crystallinity of the phase shift film 13 is low, and the roughness of the side wall of the opening pattern 13a can be reduced. The full width at half maximum FWHM is preferably 1.5° or more, and more preferably 2.0° or more. The full width at half maximum FWHM is preferably as large as possible, and there is preferably no clear peak.

The phase shift film 13 preferably contains at least one first element X1 selected from the first group consisting of O, B, C, and N in addition to Ir. The first element X1 is a non-metal element. By adding the first element X1 to Ir, it is possible to suppress the crystallization while suppressing the deterioration of the optical properties and to reduce the roughness of the side wall of the opening pattern 13a.

The first element X1 preferably contains oxygen and more preferably contains oxygen and nitrogen. With a small amount of oxygen added, the crystallization of the phase shift film 13 can be suppressed, and the deterioration of the optical properties of the phase shift film 13 can be suppressed.

The total content of the first element X1 is preferably from 1.0 at % to 49 at %, more preferably from 5.0 at % to 30 at %, still more preferably from 7.0 at % to 30 at %, particularly preferably from 15 at % to 25 at %. When the total content of the first element X1 is 1.0 at % or more, the phase shift film 13 can be prevented from being crystallized. When the total content of the first element X1 is 49 at % or less, a hydrogen resistance to be described later is favorable, and the optical properties are favorable.

Inside the EUV exposure apparatus, the reflective mask 2 may be exposed to a hydrogen gas. The hydrogen gas is used, for example, for the purpose of reducing carbon contamination. Therefore, the phase shift film 13 may be exposed to the hydrogen gas. Generally, the hydrogen gas and the first element X1 may form a hydride (e.g., $H_2O$).

When the phase shift film 13 contains the first element X1, a chemical shift ΔE1 of the peak of $4f_{7/2}$ of Ir observed by an X-ray photoelectron spectroscopy (XPS) is preferably less than 0.3 eV. When ΔE1 is less than 0.3 eV, Ir contained in the phase shift film 13 is not appreciably bonded to the first element X1.

When Ir and the first element X1 are not bonded to each other, the bond is not broken by the hydrogen gas and a hydride of the first element X1 is not generated. When the hydride of the first element X1 is generated, the hydride has high volatility, the first element X1 is desorbed from the phase shift film 13, and the phase shift film 13 is reduced. The film thickness after reduction is smaller than the film thickness before the reduction. A change in the film thickness leads to a change in phase difference.

The binding energy of an electron observed by X-ray electron spectroscopy represents a magnitude of an energy consumed when the electron is emitted. When Ir is bonded to the first element X1, Ir is positively charged. Thus, a large amount of energy is consumed for the electron to be emitted from Ir. Therefore, when Ir is bonded to the first element X1, the peak binding energy is higher than that when Ir exists alone.

The chemical shift, ΔE1, of the peak of Ir observed by X-ray electron spectroscopy is a magnitude (absolute value) of a difference between an actually observed binding energy of the peak of Ir and a binding energy of the peak of Ir when Ir exists alone without being bonded to the first element X1 (reference binding energy) (ΔE1≥ 0.0 eV). The binding energy of the actually observed peak of Ir is basically higher than or equal to the reference binding energy. The reference binding energy for each element is from the literature values described in HANDBOOK OF X-RAY PHOTOELECTRON SPECTROSCOPY (1979), (edited by C. D. Wagner, W. M. Riggs, L. E. Davis, J. F. Moulder, and G. E. Muilenberg), etc.

The chemical shift ΔE1 can be adjusted, for example, by a multicomponent sputtering method using a target containing Ir, a target containing the first element X1, and a target containing a second element X2, or by a reactive sputtering method using a target containing Ir and a target containing the second element X2. The second element X2 contained in the phase shift film 13 is selectively bonded to the first element X1 by a multicomponent sputtering method or reactive sputtering method, so that a bonding between Ir and the first element X1 is suppressed and breaking of the bonding by hydrogen gas is suppressed, and hydride formation of the first element X1 can be suppressed. Therefore, the chemical shift ΔE1 of the peak of the first element X1 can be adjusted to less than 0.3 eV. The method of supplying the first element X1 is not particularly limited, but the first element X1 is preferably supplied from a gas or a target, and more preferably supplied as a gas. Oxygen, nitrogen, and methane are preferably used as the gas. When the first element X1 is supplied as a gas, in the multicomponent sputtering method using a target containing Ir and a target containing the second element X2, the gas of the first element X1 is preferably supplied from the vicinity of the target containing the second element X2. Then, a chemical shift ΔE2, which will be described later, can be made greater than the chemical shift ΔE1.

Moreover, the chemical shift ΔE1 can also be adjusted by a multicomponent sputtering method of a target containing Ir and a compound target containing the first element X1 and the second element X2. By using the compound target containing the first element X1 and the second element X2, bonding between Ir and the first element X1 is suppressed, and breaking of bonds by hydrogen gas is also suppressed, so that formation of a hydride of the first element X1 can be suppressed. Therefore, the chemical shift ΔE1 can be adjusted to less than 0.3 eV.

In the present invention, analysis of the phase shift film by XPS is carried out by the following procedure. The analysis by XPS is performed using an analyzing apparatus "PHI 5000 VersaProbe" manufactured by ULVAC-PHI, Inc. The above apparatus is calibrated in accordance with JIS K0145.

First, a measuring sample of about a square of 1 cm per side is obtained by cutting out from a reflective mask blank. The obtained measuring sample is set in a measuring holder so that the phase shift film serves as a measuring surface.

After the measuring holder is carried into the apparatus, a part of the phase shift film is removed by an argon ion beam until a peak observed from the outermost surface becomes constant.

After the surface of the phase shift film is removed, the part where the surface is removed is irradiated with X-rays (monochromatized AlKα rays), and a photoelectron extraction angle (an angle formed by the surface of the measuring sample and a direction of the detector) is set to 45° to perform the analysis. During the analysis, a flood gun is used to suppress charge-up.

In the analysis, a wide scan is performed in the range of binding energies 0 eV-1000 eV to identify elements present, followed by a narrow scan depending on the elements present. The narrow scan is performed with, for example, a path energy of 58.7 eV, an energy step of 0.1 eV, a time/step of 50 ms, and an integration number of 5 times. The wide scan is performed with a path energy of 58.7 eV, an energy step of 1 eV, a time/step of 50 ms, and an integration number of 2 times.

Here, for the calibration of binding energy, the peak of the C1s orbit derived from carbon present on the measured sample is used. Specifically, first, the binding energy value indicating the peak of the C1s orbit in the measured sample is obtained from the analysis result of the narrow scan, and a value obtained by subtracting the binding energy value from 284.8 eV serves as the shift value. The above shift value is added to a binding energy value indicating a peak of each orbit obtained from the analysis result of the narrow scan, and a binding energy value of the peak corresponding to each orbit defined above is calculated. The binding energy may be calibrated using Au whose surface is cleaned in an ultra-high vacuum. In this case, the shift value is a value obtained by subtracting a binding energy value of the Au4f$_{7/2}$ orbit from 83.96 eV from the analysis result of the narrow scan.

When the binding energy value indicating the peak of each orbit is read from the analysis result of the narrow scan described as above, a value indicating a peak top is read as the binding energy value.

When the chemical shift ΔE1 of the peak of Ir observed by X-ray photoelectron spectroscopy is less than 0.3 eV, Ir contained and the first element X1 contained in the phase shift film 13 are not appreciably bonded. Therefore, a hydride of the first element X1 is not generated, and the first element X1 is not desorbed from the phase shift film 13. Therefore, the hydrogen resistance of the phase shift film 13 can be improved, and a change in the film thickness of the phase shift film 13 can be suppressed. ΔE1 is preferably less than 0.3 eV, more preferably 0.2 eV or less, and still more preferably 0.1 eV or less.

The phase shift film 13 preferably contains a second element Xw whose standard Gibbs energy of formation of at least one of oxide, boride, carbide, and nitride is less than or equal to −130 KJ/mol. That is, the phase shift film 13 preferably contains a compound of Ir, X1 and X2. The standard Gibbs energy of formation is a free energy required to synthesize a material from a single element with respect to a ground state that is a state in which the element stably exists in the standard state (25° C. and 1 atm). The lower the standard Gibbs energy of formation, the more stable the material.

When the standard Gibbs energy of formation of oxides, borides, carbides, or nitrides, which are compounds of the second element X2 and the first element X1, is −130 KJ/mol or less, the stability of the compound is sufficiently high. The second element X2 and the first element X1 are strongly bonded and the bonds are not broken by hydrogen gas. Therefore, the formation of hydride of the first element X1 can be suppressed and the desorption of the first element X1 from the phase shift film 13 can be suppressed. Therefore, the hydrogen resistance of the phase shift film 13 can be improved. The above standard Gibbs energy of formation is more preferably −500 kJ/mol or less.

The second element X2 is, for example, at least one selected from the second group consisting of Ta, Cr, Mo, W, Re, and Si. According to the element of the second group, the standard Gibbs energy of formation becomes −500 kJ/mol or less. Therefore, any of Ta, Cr, Mo, W, Re, and Si can suppress the generation of the hydride of the first element X1 and can suppress the desorption of the first element X1 from the phase shift film 13. Ta, Cr, Mo, W, Re, W, Re, and Si can improve the selection ratio (ER2/ER1). Furthermore, among the elements of the second group, Ta, Cr, W, and Re can improve the hydrogen resistance of the phase shift film 13 while suppressing the deterioration of the optical properties of the phase shift film 13. Furthermore, among the elements of the second group, Mo and Si can further improve the hydrogen resistance of the phase shift film 13.

In the phase shift film 13, the chemical shift ΔE2 of the peak of the second element X2 observed by X-ray photoelectron spectroscopy is preferably larger than the chemical shift ΔE1 of the peak of Ir. The peak of the second element X2 is, for example, a peak of 4f$_{7/2}$ of Ta, W, or Re, a peak of 2p$_{3/2}$ of Cr, a peak of 3d$_{5/2}$ of Mo, or a peak of 2p$_{3/2}$ of Si.

The binding energy of an electron observed by X-ray electron spectroscopy represents a magnitude of an energy consumed when the electron is emitted. When the second element X2 is bonded to the first element X1, the second element X2 is positively charged. Thus, a large amount of energy is consumed for an electron to be emitted from the second element X2. Therefore, when the second element X2 is bonded to the first element X1, the peak binding energy becomes higher than that when the second element X2 exists alone.

The chemical shift, ΔE2, of the peak of the second element X2 observed by X-ray electron spectroscopy is a magnitude (absolute value) of a difference between an actually observed binding energy of the peak of the second element X2 and a binding energy of the peak of the second element X2 when the second element X2 exists alone without being bonded to the first element X1 (reference binding energy). The binding energy of the actually observed peak of the second element X2 is basically higher than the reference binding energy.

The chemical shift ΔE2 of the peak of the second element X2 is preferably greater than the chemical shift ΔE1 of the peak of Ir. The second element X2 is more strongly bonded to the first element X1 than Ir (the bond between X2 and X1 is stronger than the bond between Ir and X1), and the bond (the bond between X2 and X1) is not broken by hydrogen gas. Therefore, the formation of hydride of the first element X1 can be suppressed, and the desorption of the first element X1 from the phase shift film 13 can be suppressed. Therefore, the hydrogen resistance of the phase shift film 13 can be improved.

The chemical shift, ΔE2, of the peak of the second element X2 observed by X-ray electron spectroscopy is preferably greater than or equal to 0.2 eV, more preferably greater than or equal to 0.3 eV, still more preferably greater than or equal to 0.5 eV, even more preferably greater than or equal to 2.0 eV, and especially preferably greater than or equal to 2.5 eV. ΔE2 is preferably as large as possible, but may be less than or equal to 5.0 eV.

The phase shift film 13 preferably contains 50 at %-98 at % of Ir, 1.0 at %-49 at % in total of the first element X1, and 1.0 at %-49 at % in total of the second element X2. When the contents of Ir, the first element X1, and the second element X2 are within the above ranges, the effect of suppressing crystallization of the phase shift film 13 and the effect of improving the hydrogen resistance of the phase shift film 13 are high.

More preferably, the phase shift film 13 contains 60 at % to 89 at % of Ir, 1.0 at % to 10 at % of the first element X1 in total, and 10 at % to 30 at % of the second element X2 in total, or contains 60 at % to 85 at % of Ir, 10 at % to 30 at % of the first element X1, and 5.0 at % to 20 at % of the second element X2. When the content of each of Ir, the first element X1, and the second element X2 is within the above range, the effect of suppressing the phase shift film 13 from being crystallized and improving the hydrogen resistance of the phase shift film 13 is high, and the effect of obtaining high optical properties is high.

In the phase shift film 13, the total content of the first element X1 is preferably 1.0 at % to 45 at %, or the total content of the second element X2 is preferably 5.0 at % to 49 at %. When the total content of the first element X1 is more than 45 at % and the total content of the second element X2 is less than 5.0 at % in the phase shift film 13, iridium oxide unstable to hydrogen is generated, and the hydrogen resistance of the reflective mask blank 1 is deteriorated.

In the phase shift film 13, when the second element X2 is Ta, a ratio (Ir/Ta) of the Ir content (at %) to the Ta content (at %) is, for example, 1 to 190. When the ratio (Ir/Ta) of the Ir content to the Ta content is 1 or more, the optical properties of the phase shift film 13 are good. When the ratio (Ir/Ta) of the Ir content to the Ta content is 190 or less, the processability of the phase shift film 13 is good. The ratio of the Ir content to the Ta content (Ir/Ta) is preferably 1 to 100, more preferably 1 to 40, still more preferably 2 to 30, particularly preferably 2 to 20, and most preferably 2 to 12.

In the phase shift film 13, when the second element X2 is Cr, a ratio (Ir/Cr) of the Ir content (at %) to the Cr content (at %) is, for example, 1 to 105. When the ratio (Ir/Cr) of the Ir content to the Cr content is 1 or more, the optical properties of the phase shift film 13 are good. When the ratio (Ir/Cr) of the Ir content to the Cr content is 105 or less, the selection ratio (ER2/ER1) is large and the processability of the phase shift film 13 is good. The ratio of the Ir content to the Cr content (Ir/Cr) is preferably 1 to 105, more preferably 2 to 105, still more preferably 3 to 105, and particularly preferably 4 to 105.

In the phase shift film 13, when the second element X2 is W, a ratio (Ir/W) of the Ir content (at %) to the W content (at %) is, for example, 1 to 100. When the ratio (Ir/W) of the Ir content to the W content is 1 or more, the optical properties of the phase shift film 13 are good. When the ratio (Ir/W) of the Ir content to the W content is 100 or less, the selection ratio (ER2/ER1) is large and the processability of the phase shift film 13 is good. The ratio of the Ir content to the W content (Ir/W) is preferably 1 to 90, more preferably 2 to 80, still more preferably 3 to 70, and particularly preferably 4 to 30.

An etching rate of the phase shift film 13 by sulfuric acid/hydrogen peroxide is 0 nm/min-0.05 nm/min. Sulfuric acid/hydrogen peroxide is used for removing a resist film, which will be described later, or cleaning the reflective mask 2. When the etching rate of the phase shift film 13 by sulfuric acid/hydrogen peroxide is 0.05 nm/min or less, damage to the phase shift film 13 during cleaning can be suppressed.

The phase shift film 13 preferably contains N as the first element X1 in addition to at least one element selected from O, C, and B. Crystallization can be suppressed by adding N to at least one element selected from O, C, and B. The total content of O, C and B is preferably 15 at % or less. Further, the N content is preferably 10 at % or less. As the total content of the first element X1 is smaller, the density is higher and the optical properties are better.

The phase shift film 13 preferably contains 1.0 at % to 10 at % of N as the first element X1. When the N content is 1.0 at % or more, even if the O content is small, it is possible to suppress the crystallization. The N content is preferably 10 at % or less, and more preferably 5.0 at % or less, from the viewpoint of optical properties.

The phase shift film 13 preferably contains 1.0 at % to 15 at % of O as the first element X1. When the O content is 1.0 at % or more, it is possible to suppress the crystallization. The O content is preferably 15 at % or less from the viewpoint of optical properties and from the viewpoint of patterning properties. If the O content exceeds 15 at %, the density decreases and the optical properties deteriorate. In addition, when the O content exceeds 15 at %, large dispersed particles are generated, and the patterning property is deteriorated.

In the phase shift film 13, when the first element X1 contains O, a ratio (Ir/O) of the Ir content (at %) to the O content (at %) is, for example, 1 to 40. When the ratio (Ir/O) of the Ir content to the O content is 1 or more, the hydrogen resistance of the phase shift film 13 can be improved. When the ratio (Ir/O) of the Ir content to the O content is 40 or less, the phase shift film 13 can be prevented from being crystallized, and the roughness of the side wall of the opening pattern 13a can be reduced. The ratio of the Ir content to the O content (Ir/O) is preferably 1 to 40, more preferably 2 to 35, still more preferably 2 to 30, particularly preferably 2 to 20, and most preferably 3 to 15.

In the phase shift film 13, when the first element X1 contains N, a ratio (Ir/N) of the Ir content (at %) to the N content (at %) is, for example, 10 to 105. When the ratio (Ir/N) of the Ir content to the N content is 10 or more, the hydrogen resistance of the phase shift film 13 can be improved. When the ratio (Ir/N) of the Ir content to the N content is 105 or less, the phase shift film 13 can be prevented from being crystallized, and the roughness of the side wall 13a of the opening pattern can be reduced. The ratio of the Ir content to the N content (Ir/N) is preferably 10 to 105, more preferably 10 to 70, still more preferably 10 to 45, particularly preferably 11 to 36, and most preferably 12 to 30.

In the phase shift film 13, when the first element X1 contains O and N, the ratio (Ir/(O+N)) of the Ir content (at %) to the sum of the O content (at %) and the N content (at %) is, for example, 1 to 45. When the ratio (Ir/(O+N)) of the Ir content to the sum of the O content and the N content is 1 or more, the hydrogen resistance of the phase shift film 13 can be improved. When the ratio (Ir/(O+N)) of the Ir content to the sum of the O content and the N content is 45 or less, the phase shift film 13 can be prevented from being crystallized, and the roughness of the side wall 13a of the opening pattern can be reduced. The ratio (Ir/(O+N)) of the Ir content to the sum of the O content and the N content is preferably 1 to 45, more preferably 2 to 30, still more preferably 2.5 to 20, particularly preferably 4 to 17, and most preferably 6 to 16.

Figure 11:
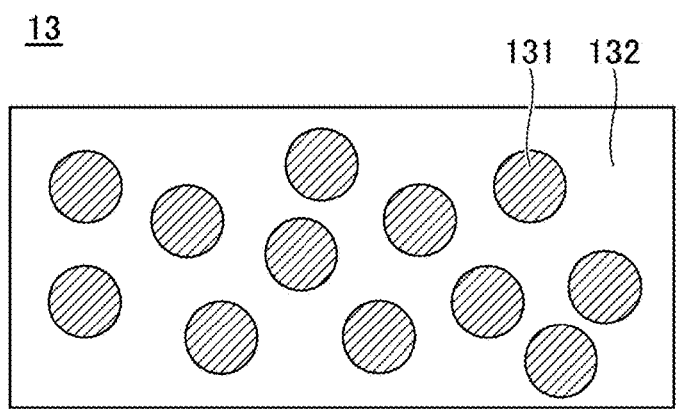
FIG. 11 is a diagram showing an example of dispersed particles and a matrix.

As shown in FIG. 11, dispersed particles 131 are particles dispersed in the matrix 132. The dispersed particles 131 are rich in the first element X1 and the second element X2, and the matrix 132 is rich in Ir. As the dispersed particles 131 become larger, the roughness of the side wall 13a of the opening pattern becomes larger and the patterning property becomes worse. This is because when the opening pattern 13a is formed, etching is liable to proceed along an interface between the dispersed particles 131 and the matrix 132.

The size of the dispersed particles 131 can be evaluated from the grayscale image. The dispersed particles 131 are richer in the first element X1 and the second element X2 than the matrix 132, and thus have a lower density. Therefore, in a grayscale image, the dispersed particles 131 appear darker than the matrix 132.

The grayscale image is obtained by imaging a cross section of the phase shift film 13 with a scanning transmission electron microscope (STEM). The grayscale image has, for example, 256 gradations, magnifications of 2.5 million times, and 0.10 nm/pixel resolutions.

The size of the dispersed particles 131 can be evaluated from a brightness profile of the grayscale image. The area for which the brightness profile is created has, for example, a vertical size of 25 nm and a horizontal size of 60 nm. Here, the vertical direction is the Z-axis direction. The lateral direction is the X-axis direction or the Y-axis direction.

Brightness profiles are generated using SurfCharJ, a plug-in tool of ImageJ (version 1.53e) distributed by the National Institutes of Health (NIH). ImageJ is an open source and public domain image processing software. SurfCharJ can be used to obtain roughness parameters in the brightness profile of the image, such as skewness (Rsk).

The skewness (Rsk) in the brightness profile is preferably negative. When Rsk is negative, there are many fine valleys around the average line, the size of the dispersed particles 131 is small, and the structure of the phase shift film 13 is uniform. Therefore, when Rsk is negative, the patterning property is good. Rsk is more preferably −0.01 or less. Rsk is determined in accordance with JIS B0601: 2013.

The method of forming the phase shift film 13 is, for example, a DC sputtering method, a magnetron sputtering method, or an ion beam sputtering method. The oxygen content of the phase shift film 13 can be controlled by the content of the $O_2$ gas in the sputtering gas. Further, the content of nitrogen in the phase shift film 13 can be controlled by the content of $N_2$ gas in the sputtering gas.

When an IrTaON film is formed by using the reactive sputtering method, an example of film formation conditions is as follows.

<Film Formation Conditions for IrTaON Film>
Targets: Ir target and Ta target (or IrTa target);
Power density of Ir target: 1.0 W/cm$^2$ to 8.5 W/cm$^2$;
Power density of Ta target: 1.0 W/cm$^2$ to 8.5 W/cm$^2$;
Sputtering gas: a mixture of Ar gas, $O_2$ gas, and $N_2$ gas;
Volume ratio of $O_2$ gas to the sputtering gas ($O_2/(Ar+O_2+N_2)$):0.01 to 0.25;
Volume ratio of $N_2$ gas to the sputtering gas ($N_2/(Ar+O_2+N_2)$):0.01 to 0.25;
Film formation rate: 0.020 nm/sec to 0.060 nm/sec; and
Film thickness: 20 nm to 60 nm.

The phase shift film 13 is a single layer in the present embodiment, but may be composed of a plurality of layers. The phase shift film 13 may have a layer not containing Ir. The phase shift film 13 may contain 50 at % or more of Ir as a whole. When the phase shift film 13 includes the first layer and the second layer, the refractive index n of the phase shift film 13 is calculated from the following formula (1).

[Math 1]

$$n = n_1 \cdot \frac{t_1 \cdot \frac{d_1}{M_1}}{t_1 \cdot \frac{d_1}{M_1} + t_2 \cdot \frac{d_2}{M_2}} + n_2 \cdot \frac{t_2 \cdot \frac{d_2}{M_2}}{t_1 \cdot \frac{d_1}{M_1} + t_2 \cdot \frac{d_2}{M_2}} \quad (1)$$

where $n_1$ is the refraction index of the first layer, $n_2$ is the refraction index of the second layer, $t_1$ is the thickness of the first layer, $t_2$ is the thickness of the second layer, $d_1$ is the density of the first layer, $d_2$ is the density of the second layer, $M_1$ is the atomic mass of the first layer, and $M_2$ is the atomic mass of the second layer.

When the phase shift film 13 includes the first layer and the second layer, the extinction coefficient k of the phase shift film 13 is calculated from the following formula (2).

[Math 2]

$$k = k_1 \cdot \frac{t_1 \cdot \frac{d_1}{M_1}}{t_1 \cdot \frac{d_1}{M_1} + t_2 \cdot \frac{d_2}{M_2}} + k_2 \cdot \frac{t_2 \cdot \frac{d_2}{M_2}}{t_1 \cdot \frac{d_1}{M_1} + t_2 \cdot \frac{d_2}{M_2}} \quad (2)$$

where $k_1$ is the extinction coefficient of the first layer, $k_2$ is the extinction coefficient of the second layer, $t_1$ is the thickness of the first layer, $t_2$ is the thickness of the second layer, $d_1$ is the density of the first layer, $d_2$ is the density of the second layer, $M_1$ is the atomic mass of the first layer, and $M_2$ is the atomic mass of the second layer.

The phase shift film 13 may include, in addition to the first layer and the second layer, a third layer having a chemical composition different from that of the first layer and the second layer. Also in the case where the third layer is included, the refractive index n and the extinction coefficient k can be calculated using formulas similar to the above formulas (1) and (2).

The etching mask film 14 is formed on a side opposite to the protection film 12 with respect to the phase shift film 13, and is used to form an opening pattern 13a in the phase shift film 13. A resist film (not shown) is formed on the etching mask film 14. In the manufacturing process of the reflective mask 2, a first opening pattern is formed on the resist film, then a second opening pattern is formed on the etching mask film 14 using the first opening pattern, and then a third opening pattern 13a is formed on the phase shift film 13 using the second opening pattern. The first opening pattern, the second opening pattern, and the third opening pattern 13a have identical dimensions and identical shapes in a plan view (viewed along the Z-axis direction). The etching mask film 14 enables thinning of the resist film.

The etching mask film 14 preferably contains at least one element selected from Al, Hf, Y, Cr, Nb, Ti, Mo, Ta, and Si. The etching mask film 14 may further contain at least one element selected from O, N, and B.

The film thickness of the etching mask film 14 is preferably 2 nm-30 nm, more preferably 2 nm-25 nm, and even more preferably 2 nm-10 nm.

The deposition method of the etching mask film 14 is, for example, a DC sputtering method, magnetron sputtering method, or ion beam sputtering method.

Figure 4:
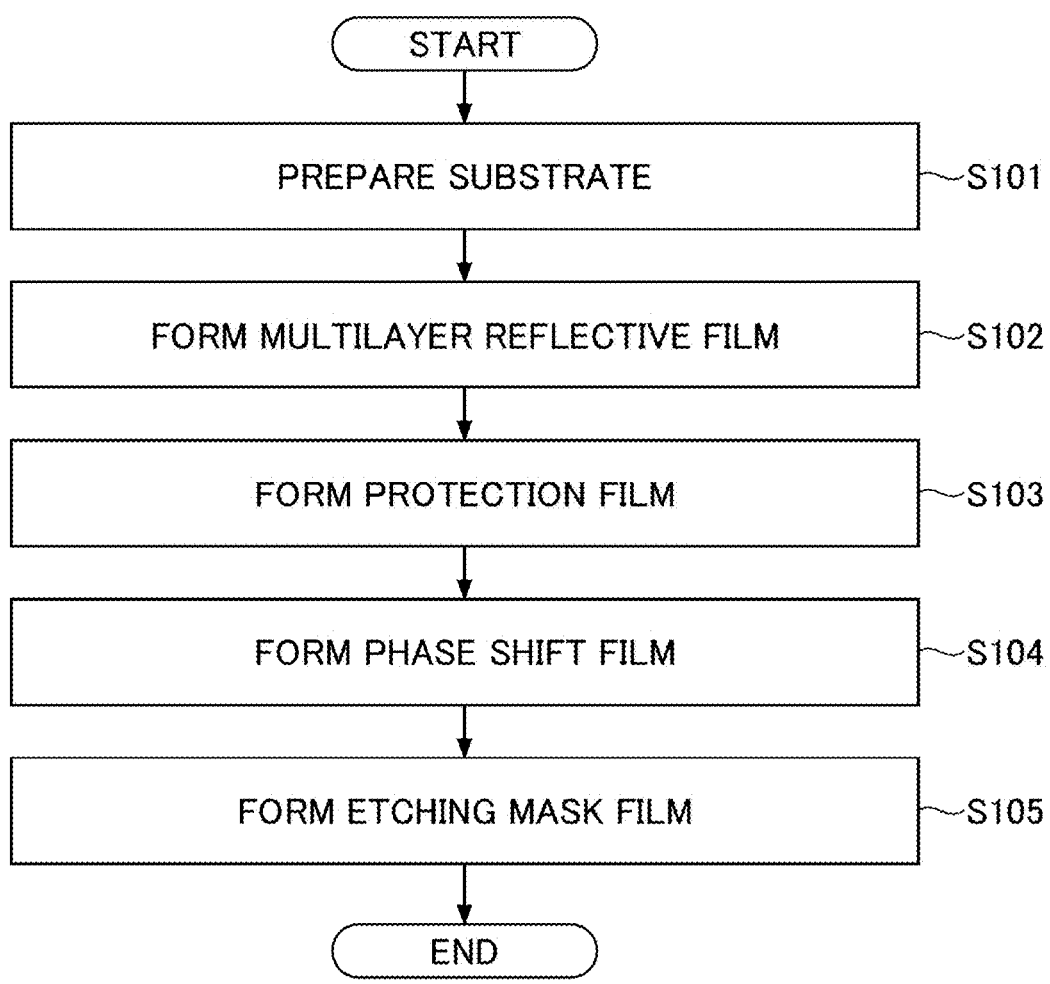
FIG. 4 is a flowchart showing a method of manufacturing a reflective mask blank according to the embodiment.

Next, a method of manufacturing the reflective mask blank 1 according to the embodiment of the present invention will be described with reference to FIG. 4. The method of manufacturing the reflective mask blank 1 has, for example, steps S101 to S105 shown in FIG. 4. A substrate 10 is prepared (step S101). A multilayer reflective film 11 is formed on a first main surface 10a of the substrate 10 (step S102). A protection film 12 is formed on the multilayer reflective film 11 (step S103). A phase shift film 13 is formed on the protection film 12 (step S104). An etching mask film 14 is formed on the phase shift film 13 (step S105).

The manufacturing method of the reflective mask blank 1 is required to have at least steps S101 to S104. The manufacturing method of the reflective mask blank 1 may further include a step of forming a functional film (not shown in FIG. 4).

Figure 5:
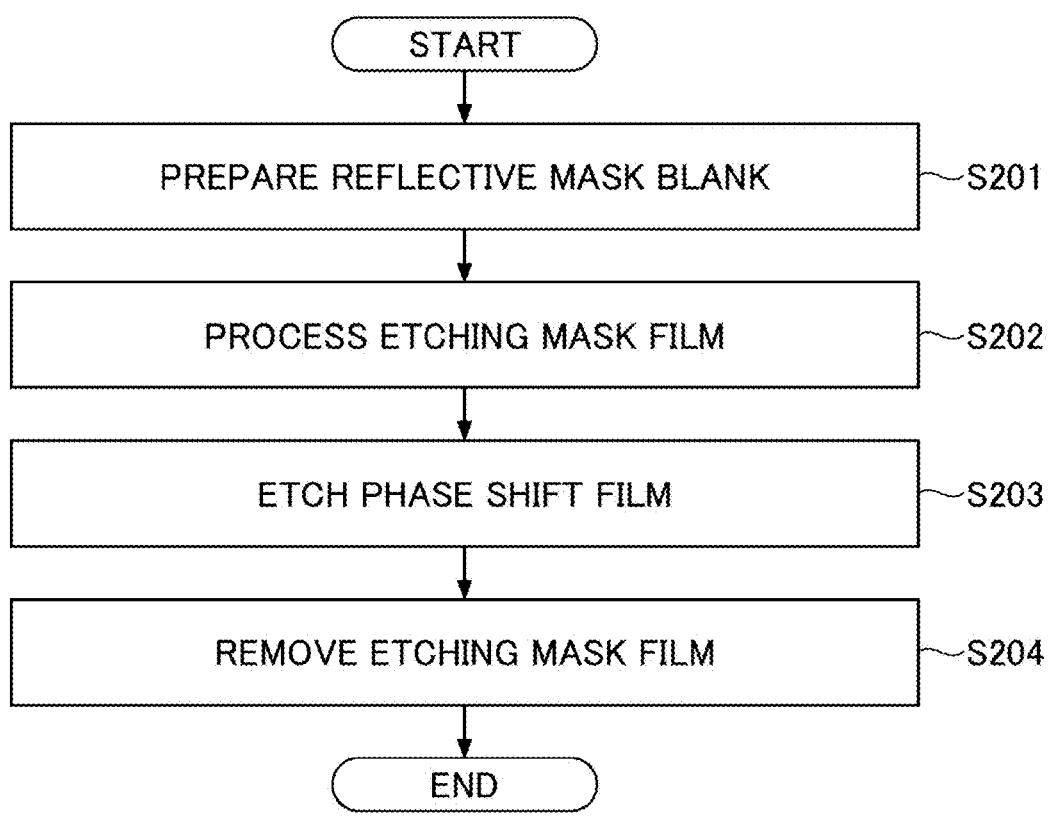
FIG. 5 is a flowchart showing a method of manufacturing a reflective mask according to the embodiment.

Next, a method of manufacturing the reflective mask 2 according to the embodiment of the present invention will be described with reference to FIG. 5. The method of manufacturing the reflective mask 2 has steps S201 to S204 shown in FIG. 5. A reflective mask blank 1 is prepared (step S201). An etching mask film 14 is processed (step S202). A resist film (not shown) is provided on the etching mask film 14. A first opening pattern is formed on the resist film, then a second opening pattern is formed on the etching mask film 14 using the first opening pattern. A third opening pattern 13a is formed on the phase shift film 13 using the second opening pattern (step S203). In step S203, the phase shift film 13 is etched using etching gas. The resist film and the etching mask film 14 are removed (step S204). The resist film is removed using, for example, sulfuric acid/hydrogen peroxide. The etching mask film 14 is removed using, for example, etching gas. The etching gas used in step S204 (to remove the etching mask film 14) may be the same type as the etching gas used in step S203 (to etch the phase shift film 13). The manufacturing method of the reflective mask 2 is required to have at least steps S201 and S203.

EXAMPLES

In the following, experimental data will be described.

Examples 1 to 12, 19 and 20

In Examples 1 to 12, 19, and 20, reflective mask blanks for EUVL were fabricated under the same conditions except for the film type of the phase shift film and the film formation conditions thereof. Each reflective mask blank included a substrate, a multilayer reflective film, a protection film, and a phase shift film. Example 1 is a comparative example, and Examples 2 to 12, 19, and 20 are practical examples.

As the substrate, a $SiO_2$—$TiO_2$-based glass substrate (outer shape: a square of 6 inches (152 mm) per side and 6.3 mm thick) was prepared. The glass substrate had a thermal expansion coefficient of $0.02 \times 10^{-7}/°$ C. at 20° C., a Young's modulus of 67 GPa, a Poisson's ratio of 0.17, and a specific stiffness of $3.07 \times 10^7$ $m^2/s^2$. A quality-guaranteed region of a first main surface of the substrate had a root-mean-square roughness (Rq) of 0.15 nm or less and a flatness of 100 nm or less by polishing. A Cr film with a thickness of 100 nm was deposited on a second main surface of the substrate by the magnetron sputtering method. A sheet resistance of the Cr film was 100 Ω/□.

As the multilayer reflective film, a Mo/Si multilayer reflective film was formed. The Mo/Si multilayer reflective film was formed by repeating 40 times deposition of a Si layer (film thickness was 4.5 nm) and a Mo layer (film thickness was 2.3 nm) using the ion beam sputtering method. The total film thickness of the Mo/Si multilayer reflective film was 272 nm (40(4.5 nm+2.3 nm)).

As the protection film, a Rh film (film thickness was 2.5 nm) was formed. The Rh film was formed using the DC sputtering method.

As the phase shift film, an Ir film, an IrTaON film, or an IrCrON film was formed. In Example 1, the Ir film was formed using the DC sputtering method. In Examples 2 to 4, 6 to 9, 11, and 12, the IrTaON film was formed using the reactive sputtering method. In Examples 5 and 10, the IrCrON film was formed using the reactive sputtering method.

The film types and characteristics of the phase shift films obtained in Examples 1 to 12, 19, and 20 are shown in TABLE 1.

TABLE 1

| | | Composition | | | | | Optical property | | Crystallinity | | | |
|---|---|---|---|---|---|---|---|---|---|---|---|---|
| | Film type | Ir [at %] | Ta [at %] | Cr [at %] | O [at %] | N [at %] | Refractive Index n | Extinction coefficient k | FWHM [degrees] | Crystallite size [Å] | Ip/Ia | Density [g/cm³] |
| Ex. 1 | Ir | 100 | — | — | — | — | 0.905 | 0.0440 | 1.063 | 83.210 | 53.68 | 22.307 |
| Ex. 2 | IrTaON | 78.0 | 3.3 | — | 16.7 | 1.9 | 0.910 | 0.0417 | 1.851 | 47.760 | 4.13 | 16.876 |
| Ex. 3 | IrTaON | 71.4 | 6.1 | — | 20.5 | 2.0 | 0.916 | 0.0392 | 2.104 | 42.010 | 3.72 | 15.370 |
| Ex. 4 | IrTaON | 74.1 | 7.2 | — | 17.8 | 1.1 | 0.915 | 0.0412 | 1.766 | 50.070 | 4.34 | 16.182 |
| Ex. 5 | IrCrON | 80.5 | — | 0.8 | 15.4 | 3.3 | 0.914 | 0.0400 | 2.232 | 39.600 | 3.29 | 15.720 |
| Ex. 6 | IrTaON | 69.1 | 22.9 | — | 3.1 | 4.9 | 0.909 | 0.0432 | 1.900 | 46.000 | 5.68 | 19.559 |
| Ex. 7 | IrTaON | 75.1 | 18.7 | — | 2.5 | 3.8 | 0.905 | 0.0445 | 1.635 | 54.010 | 5.39 | 19.675 |
| Ex. 8 | IrTaON | 78.2 | 14.1 | — | 4.3 | 3.4 | 0.904 | 0.0445 | 1.628 | 54.270 | 5.51 | 19.575 |
| Ex. 9 | IrTaON | 82.2 | 8.6 | — | 6.9 | 2.2 | 0.906 | 0.0434 | 1.352 | 65.410 | 6.26 | 19.063 |
| Ex. 10 | IrCrON | 62.0 | — | 15.0 | 17.4 | 4.8 | 0.917 | 0.0389 | 2.207 | 40.050 | 3.02 | 13.227 |

TABLE 1-continued

| | Film type | Composition | | | | | Optical property | | Crystallinity | | | Density [g/cm³] |
|---|---|---|---|---|---|---|---|---|---|---|---|---|
| | | Ir [at %] | Ta [at %] | Cr [at %] | O [at %] | N [at %] | Refractive Index n | Extinction coefficient k | FWHM [degrees] | Crystallite size [Å] | Ip/Ia | |
| Ex. 11 | IrTaON | 85.4 | 4.1 | — | 8.2 | 2.4 | 0.903 | 0.0444 | 1.087 | 81.310 | 8.15 | 19.509 |
| Ex. 12 | IrTaON | 91.3 | 2.5 | — | 4.3 | 1.9 | 0.899 | 0.0456 | 0.996 | 88.760 | 9.70 | 19.909 |
| Ex. 19 | IrTaO | 67.4 | 9.9 | — | 22.7 | — | 0.915 | 0.0407 | 2.038 | 43.390 | 3.57 | 16.400 |
| Ex. 20 | IrTaO | 80.5 | 17.0 | — | 2.1 | — | 0.898 | 0.0476 | 1.099 | 80.380 | 17.54 | 21.531 |

The composition of the phase shift film was measured using an X-ray photoelectron spectrometer (PHI 5000 VersaProbe) by ULVAC-PHI, Inc. The compositions of the phase shift film shown in TABLE 1 were measured before exposing the phase shift film to hydrogen gas.

For the optical properties (refractive index n and extinction coefficient k) of the phase shift film, values in the database of the Center for X-Ray Optics, Lawrence Berkeley National Laboratory, or values calculated from a formula of "incident angle dependence" of reflectance, which will be described later, were used.

The incident angle θ of the EUV light, the reflectance R for the EUV light, the refractive index n of the phase shift film, and the extinction coefficient k of the phase shift film satisfy the following equation (3), $$R = \left| \frac{\sin\theta - ((n+ik)^2 - \cos^2\theta)^{1/2}}{\sin\theta + ((n+ik)^2 - \cos^2\theta)^{1/2}} \right|. \quad (3)$$

Measurements are made for the combination of the incident angle θ and the reflectance R a plurality of times, and the refractive index n and extinction coefficient k are estimated by the least squares method so that errors between the plural measurement data and the values of the equation (3) are minimized.

The crystallinity (full width at half maximum (FWHM) and crystallite size) of the phase shift film was measured using an X-ray diffraction instrument (MiniFlex II, by Rigaku Corporation). X-ray diffraction spectra of the phase shift films are shown in FIGS. 7 to 10. The FWHM shown in TABLE 1 is the full width at half maximum of the peak having the highest intensity in the range of 2θ of 35° to 60°. The crystallite size was calculated from the FWHM and the like using Scherrer's equation.

The peak intensity ratio Ip/Ia was calculated by obtaining the average value Ia of the intensity at 2θ within the range of 55° to 60° and the maximum value Ip of the peak intensity at 2θ within the range of 35° to 45°, and dividing Ip by Ia.

The density of the phase shift film was measured using X-Ray Reflectometry (XRR).

As shown in FIGS. 7 to 10 and TABLE 1, in Examples 2 to 12, 19, and 20, different from Example 1, the phase shift film contained at least one first element X1 selected from the first group consisting of O, B, C, and N in addition to Ir. As a result, in Examples 2 to 12, 19, and 20, the peak intensity ratio Ip/Ia was 30 or less, and the crystallinity was lower than that in Example 1. As the crystallinity is lower, the roughness of the side wall 13a of the opening pattern can be made smaller. In addition, FIG. 6 and TABLE 1 show that it is possible to suppress crystallization while suppressing deterioration of optical properties by adding the first element X1 to Ir.

In Examples 2 to 10 and 19, the full width at half maximum (FWHM) was 1.2° or more, different from Example 1, and the crystallite size was smaller than that in Example 1. As the crystallite size is smaller, the crystallinity is lower and the roughness of the side wall 13a of the opening pattern can be reduced.

Figure 6:
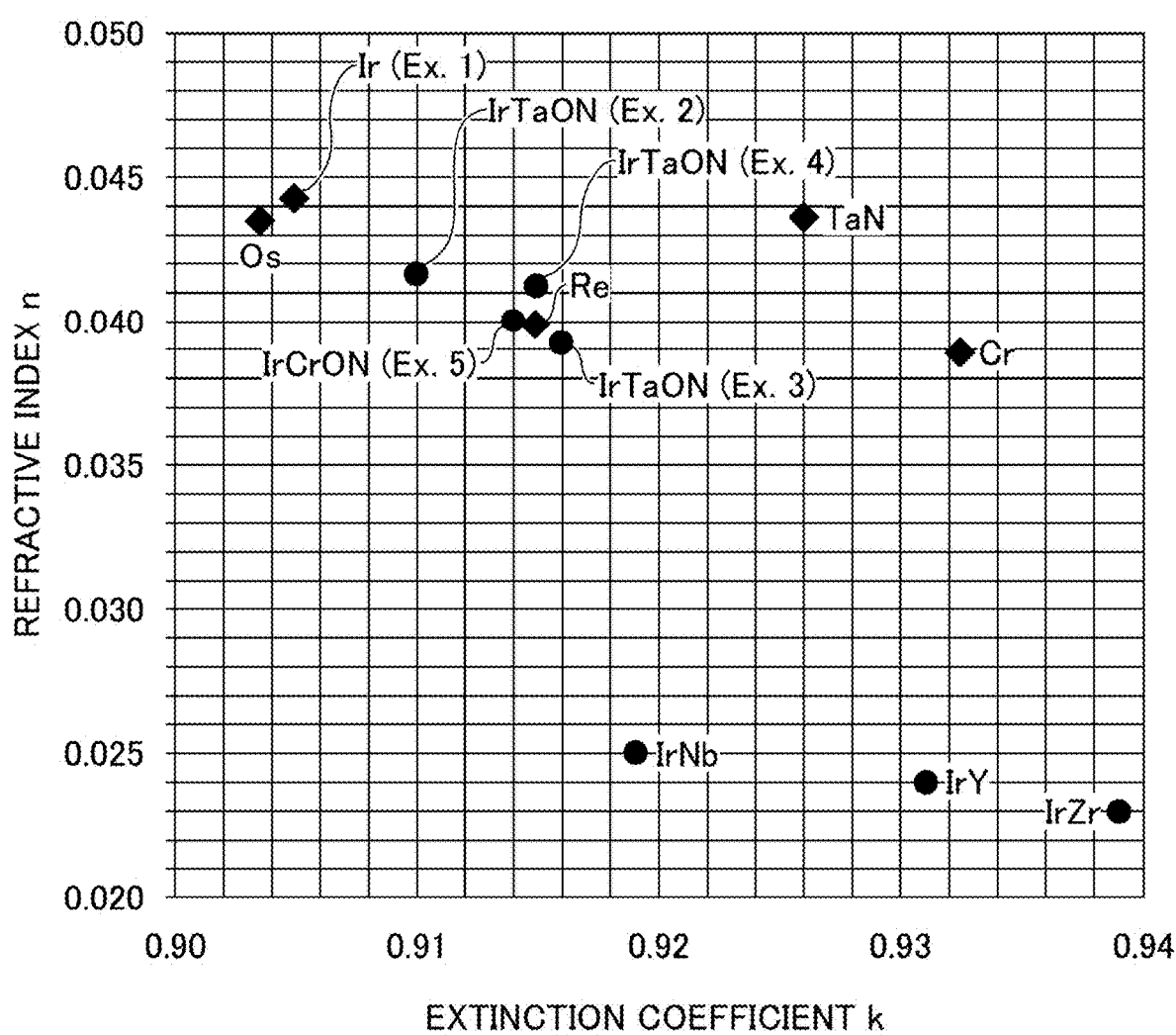
FIG. 6 is a diagram showing optical properties of the phase shift films according to Examples 1 to 5.
Figure 7:
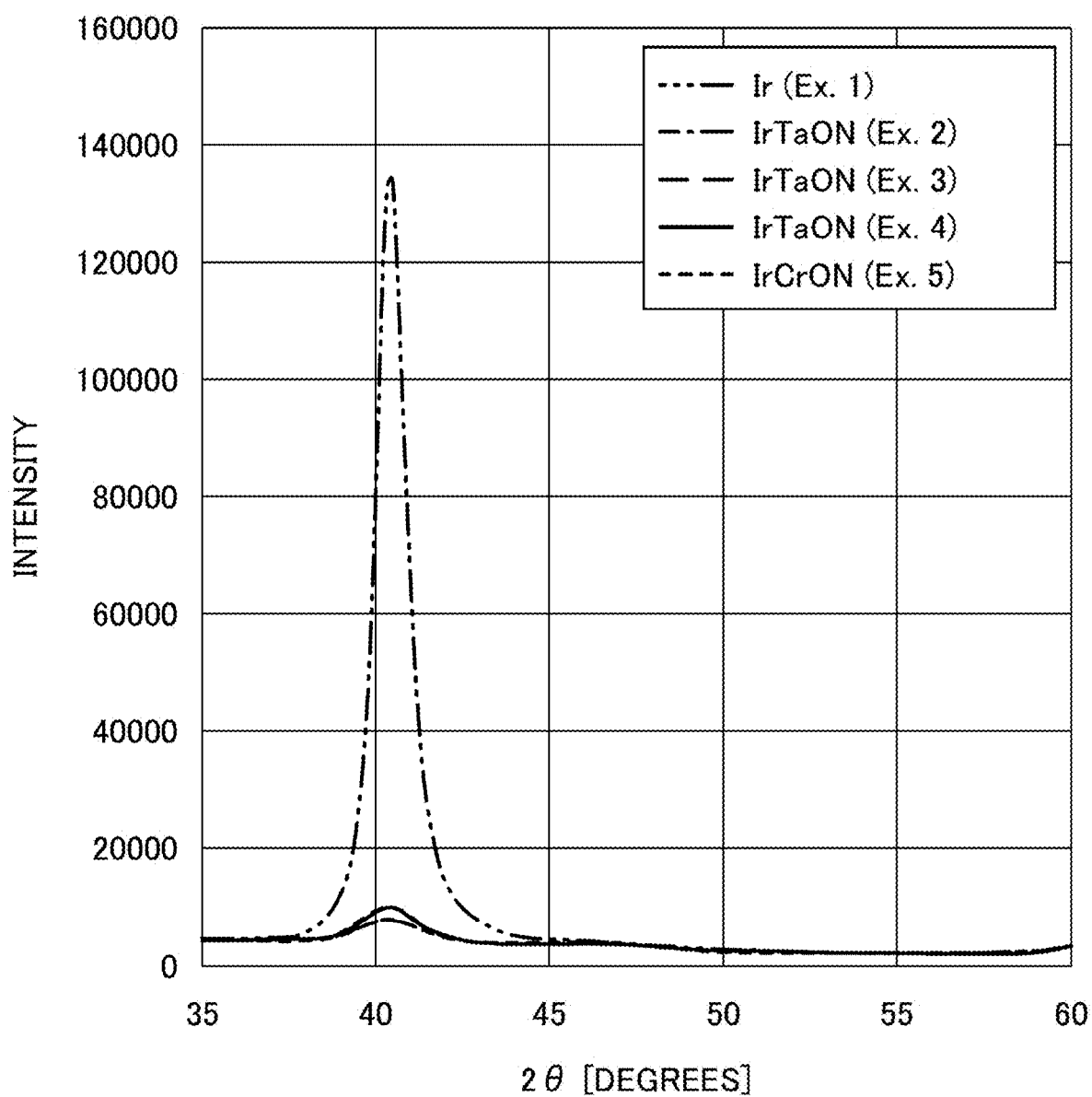
FIG. 7 is a diagram showing X-ray diffraction spectra of the phase shift films according to Examples 1 to 5.
Figure 8:
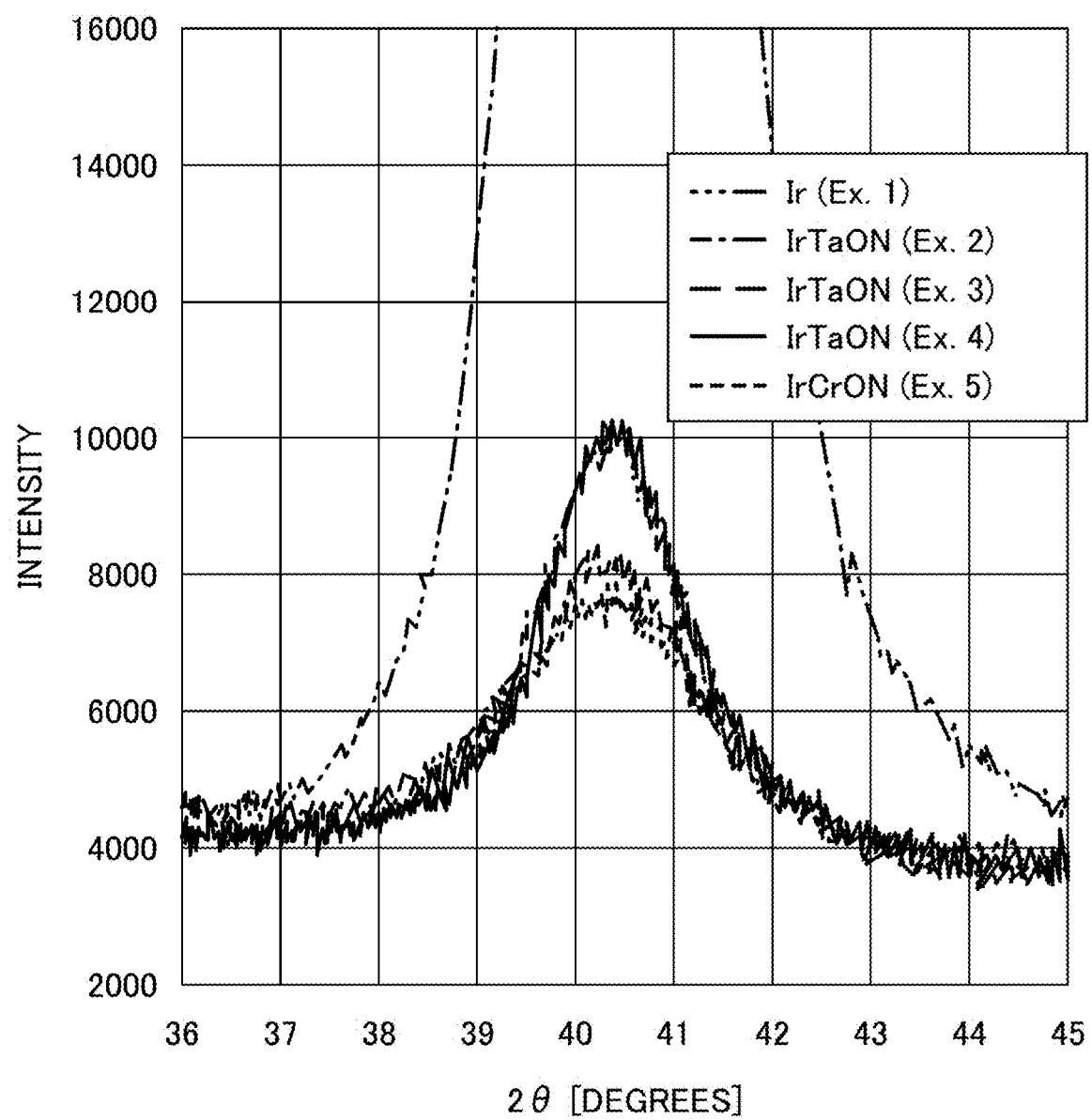
FIG. 8 is an enlarged view of a portion of the diagram shown in FIG. 7.
Figure 9:
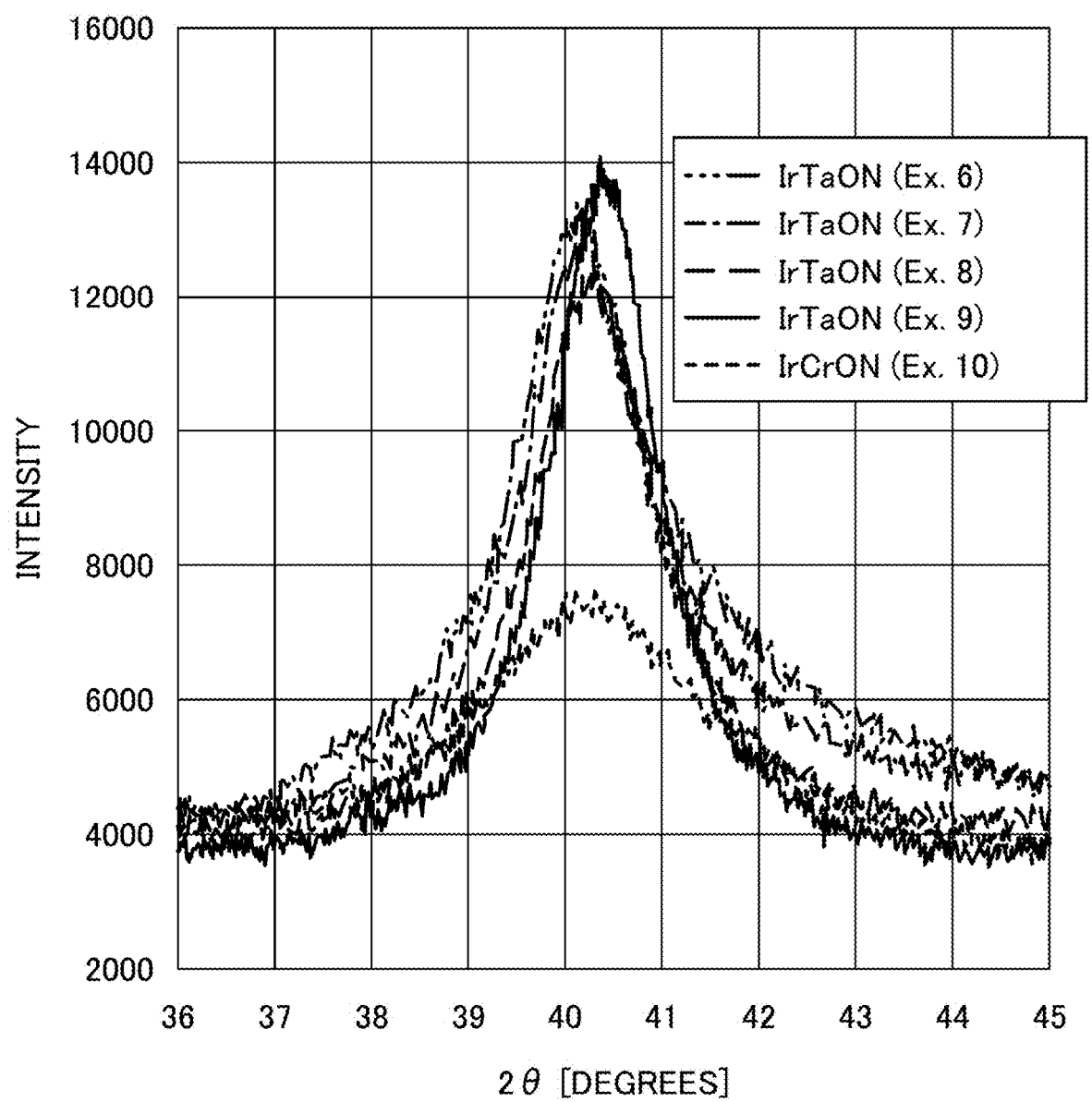
FIG. 9 is a diagram showing X-ray diffraction spectra of the phase shift films according to Examples 6 to 10.
Figure 10:
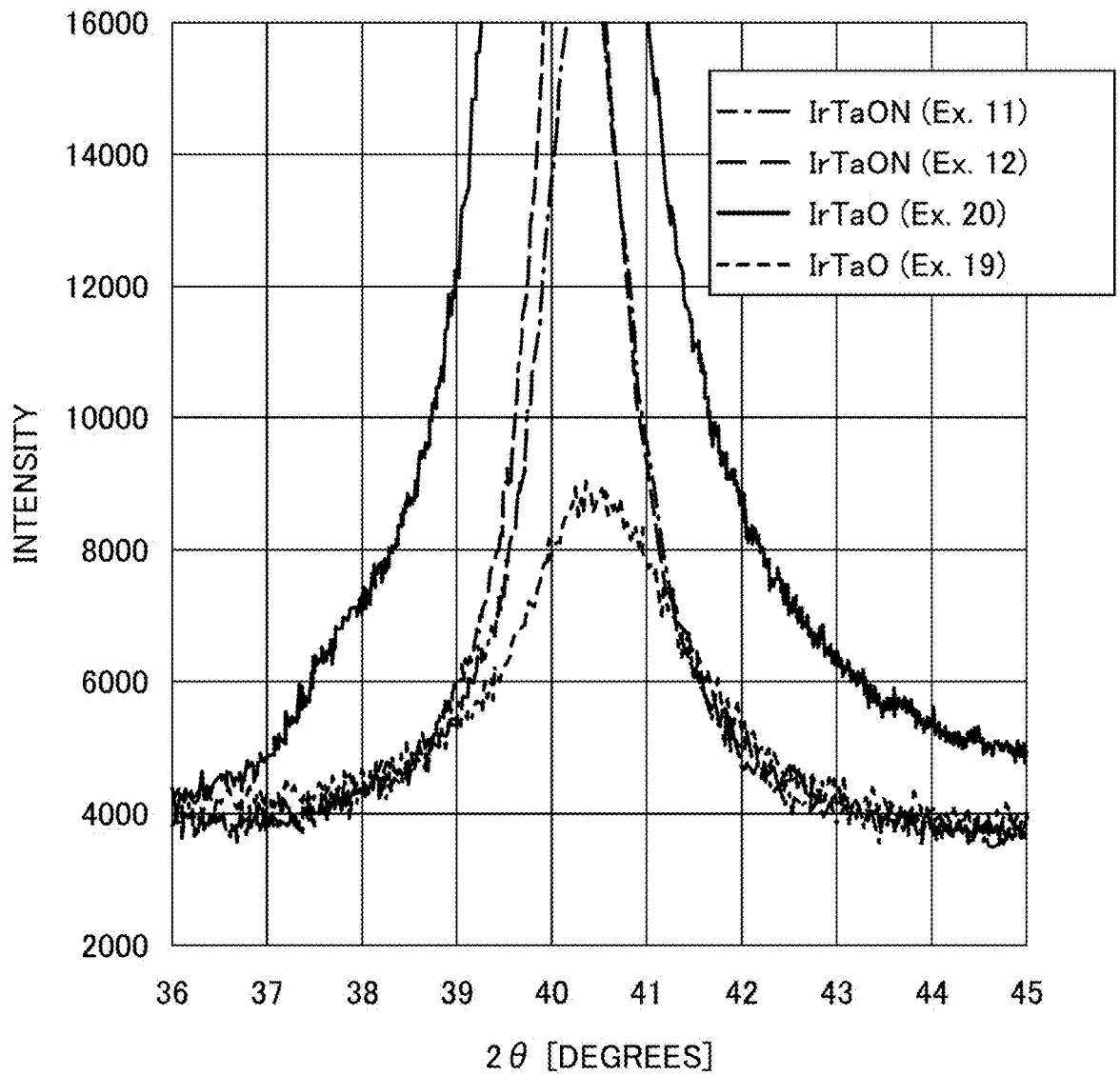
FIG. 10 is a diagram showing X-ray diffraction spectra of the phase shift films according to Examples 11, 12, 19, and 20.

FIG. 6 shows that IrNb, in which an Ir content is 50 at % and a Nb content is 50 at %, the refraction index n is 0.919, and the extinction coefficient k is 0.025. FIG. 6 shows that IrY, in which an Ir content is 50 at % and a Y content is 50 at %, the refraction index n is 0.931, and the extinction coefficient k is 0.024. Further, FIG. 6 shows that IrZr, in which an Ir content is 50 at % and a Zr content is 50 at %, the refraction index n is 0.939, and the extinction coefficient k is 0.023. When Ir is alloyed with Nb, Zr, or Y, there is a possibility that crystallization of Ir can be suppressed, but the optical properties (refractive index n and extinction coefficient k) of the phase shift film 13 may degrade.

Examples 13 to 18

In Examples 13 to 18, reflective mask blanks for EUVL each including a substrate, a multilayer reflective film, a protection film, and a phase shift film, were fabricated under the same conditions as in Examples 2 to 12 except for the film type of the phase shift film and the film formation conditions thereof. Examples 13 to 18 are practical examples.

The film types and properties of the phase shift films obtained in Examples 13 to 18 are shown in TABLE 2.

TABLE 2

| | Film type | Composition | | | | | Optical property | | Crystallinity | | | Chemical shift | |
|---|---|---|---|---|---|---|---|---|---|---|---|---|---|
| | | Ir [at %] | Ta [at %] | Cr [at %] | O [at %] | N [at %] | Refractive index n | Extinction coefficient k | FWHM [degrees] | Crystallite size [Å] | Ip/Ia | ΔE1 [eV] | ΔE2 [eV] |
| Ex. 13 | IrTaON | 74.1 (73.1) | 7.2 (8.2) | — | 17.8 (17.1) | (1.6) 1.1 | 0.915 | 0.041 | 1.77 | 50.07 | 4.3 | 0.0 | 1.0 |
| Ex. 14 | IrTaON | 75.0 (75.1) | 8.3 (7.9) | — | 15.0 (15.1) | (1.9) 1.7 | 0.910 | 0.042 | 1.42 | 62.09 | 5.7 | 0.0 | 1.0 |

TABLE 2-continued

| | Film type | Composition | | | | | Optical property | | Crystallinity | | | Chemical shift | |
|---|---|---|---|---|---|---|---|---|---|---|---|---|---|
| | | Ir [at %] | Ta [at %] | Cr [at %] | O [at %] | N [at %] | Refractive index n | Extinction coefficient k | FWHM [degrees] | Crystallite size [Å] | Ip/Ia | ΔE1 [eV] | ΔE2 [eV] |
| Ex. 15 | IrTaON | 78.2 (78.5) | 6.5 (6.1) | — | 12.9 (12.4) | 2.4 (2.9) | 0.909 | 0.422 | 1.31 | 67.54 | 6.4 | 0.0 | 1.0 |
| Ex. 16 | IrTaON | 93.4 (94.7) | 0.5 (0.9) | — | 5.2 (2.0) | 0.9 (2.4) | 0.898 | 0.046 | 1.00 | 88.21 | 9.8 | 0.0 | 0.3 |
| Ex. 17 | IrTaON | 76.6 (93.8) | 0.8 (1.8) | — | 19.8 (2.9) | 2.8 (1.5) | 0.913 | 0.040 | 2.43 | 36.31 | 2.8 | 0.0 | 0.3 |
| Ex. 18 | IrCrON | 80.5 (94.9) | — | 0.81 (0.96) | 15.4 (2.06) | 3.3 (2.1) | 0.914 | 0.040 | 2.23 | 39.60 | 3.3 | 0.0 | 0.3 |

The composition and optical properties of the phase shift film were measured in the same manner as in TABLE 1. In TABLE 2, the contents shown in parentheses are values measured after hydrogen exposure. The hydrogen exposure was carried out by attaching a test piece obtained by cutting the test sample into a shape of a square of 2.5 cm per side to a Si dummy substrate, setting the test piece in a hydrogen-irradiation test apparatus, and irradiating the test piece with hydrogen (including hydrogen ions).

The chemical shifts ΔE1 and ΔE2 of the phase shift film were measured using an X-ray photoelectron spectrometer (PHI 5000 VersaProbe) manufactured by ULVAC-PHI, Inc. ΔE1 is a chemical shift of the $4f_{7/2}$ peak of Ir. ΔE2 is a chemical shift of the $4f_{7/2}$ peak of Ta or the $2p_{3/2}$ peak of Cr.

As shown in TABLE 2, in Examples 13 to 15, unlike Examples 16 to 17, the total content of the second element X2 (Ta and Cr) in the phase shift film before hydrogen exposure was 1.0 at % or more. As a result, desorption of O from the phase shift film could be suppressed. This is considered to be because O is strongly bonded to Ta, and the bond is not broken by the hydrogen exposure.

<Analysis Results of STEM Images>

In Examples 3, 6, 9, 11, 12, and 19, a grayscale image was obtained by imaging a cross section of the obtained phase shift film with a STEM, and a brightness profile of the grayscale image was created. Analysis results of the brightness profiles and the compositions are shown in TABLE 3.

TABLE 3

| | Film type | composition | | | | | Property of brightness profile |
|---|---|---|---|---|---|---|---|
| | | Ir [at %] | Ta [at %] | Cr [at %] | O [at %] | N [at %] | Rsk |
| Ex. 3 | IrTaON | 71.4 | 6.1 | — | 20.5 | 2.0 | 0.200 |
| Ex. 6 | IrTaON | 69.1 | 22.9 | — | 3.1 | 4.9 | −0.402 |
| Ex. 9 | IrTaON | 82.2 | 8.6 | — | 6.9 | 2.2 | −0.293 |
| Ex. 11 | IrTaON | 85.4 | 4.1 | — | 8.2 | 2.4 | −0.189 |
| Ex. 12 | IrTaON | 91.3 | 2.5 | — | 4.3 | 1.9 | −0.203 |
| Ex. 19 | IrTaO | 67.4 | 9.9 | — | 22.7 | — | 0.0695 |

Figure 12:
FIG. 12 is a STEM image of the phase shift film according to Example 1.
Figure 13:
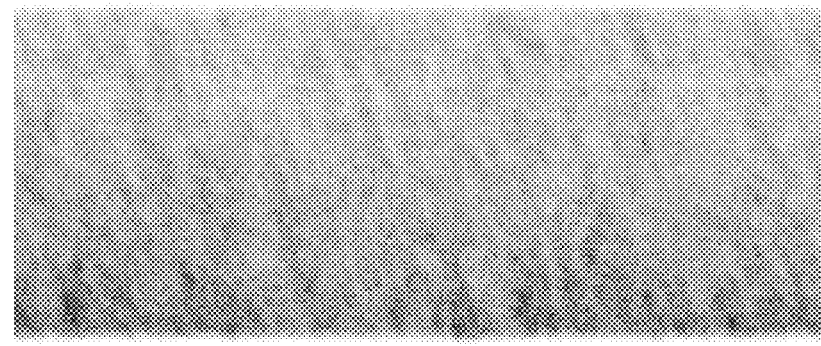
FIG. 13 is a STEM image of the phase shift film according to Example 6.
Figure 14:
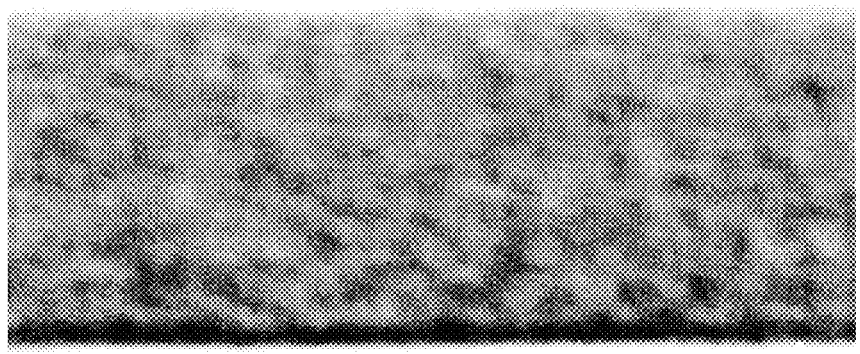
FIG. 14 is a STEM image of the phase shift film according to Example 19.

As shown in TABLE 3, in Examples 6, 9, 11 and 12, unlike Examples 3 and 19, since the O content was 15 at % or less, the size of dispersed particles generated in the phase shift film was small, the skewness Rsk was negative, and the structure of the phase shift film was uniform. If the structure of the phase shift film is uniform, the patterning property is good. The STEM image of Example 1 is shown in FIG. 12, the STEM image of Example 6 is shown in FIG. 13, and the STEM image of Example 19 is shown in FIG. 14.

A line-and-space pattern was formed on the fabricated reflective mask blank for EUVL in each of Example 1 and Example 6, and then an etching test was carried out under the following condition. The etching test was performed using an inductively coupled plasma (ICP) etching apparatus. As an etching gas, a mixture gas of a $CF_4$ gas and an $O_2$ gas was used. Specific conditions for the inductively coupled plasma etching were as follows.

ICP antenna bias: 1200 W;

Substrate bias: 50 W;

Etching pressure: $2.0 \times 10^{-1}$ Pa;

Etching gas: a mixture gas of $CF_4$ gas and $O_2$ gas;

Flow rate of $CF_4$ gas: 28 sccm;

Flow rate of $O_2$ gas: 7 sccm; and

Etching time: 285 seconds.

An SEM image of the surface of the reflective mask blank for EUVL after the etching test was obtained, and a line edge roughness (LER) was calculated and shown in TABLE 4.

TABLE 4

| | Ip/Ia | LER [nm] |
|---|---|---|
| Ex. 1 | 53.68 | 2.85 |
| Ex. 6 | 5.68 | 1.88 |

As shown in TABLE 4, in Example 1 in which the value of Ip/Ia was large and the crystallinity was high, the value of LER was found to be large and the pattern roughness was poor, as compared with Example 6 in which the value of Ip/Ia was small and the crystallinity was low.

As described above, the reflective mask blank, the reflective mask, the method of manufacturing the reflective mask blank, and the method of manufacturing the reflective mask according to the present disclosure have been described. However, the present disclosure is not limited to the above-described embodiments, and the like. Various variations, modifications, substitutions, additions, deletions, and combinations are possible within the scope of claims. They also of course fall within the technical scope of the present disclosure.

What is claimed is:

1. A reflective mask blank, comprising:
a substrate;
a multilayer reflective film that reflects EUV light;
a protection film that protects the multilayer reflective film; and
a phase shift film that shifts a phase of the EUV light, in this order,
wherein the phase shift film contains Ir as a main component;
a ratio (Ip/Ia) of a maximum value Ip of an intensity of a peak in a range of 2θ of 35 degrees to 45 degrees to an average value Ia of an intensity in a range of 2θ of 55 degrees to 60 degrees by an XRD method with a CuKα ray is 1.0 or more and 30 or less;
a refractive index n of the phase shift film to the EUV light is 0.925 or less;
an extinction coefficient k of the phase shift film to the EUV light is 0.030 or more; and
the phase shift film contains 50 at % or more of Ir, contains O and N, and contains at least one second element X2 selected from a second group consisting of Ta, Cr, Mo, W, Re, and Si.

2. The reflective mask blank according to claim 1, wherein a chemical shift of a peak of $4f_{7/2}$ of Ir contained in the phase shift film observed by an X-ray photoelectron spectroscopy is less than 0.3 eV; and
a chemical shift of a peak of the second element X2 observed by the X-ray photoelectron spectroscopy is larger than the chemical shift of the peak of $4f_{7/2}$ of Ir.

3. The reflective mask blank according to claim 1, wherein the phase shift film contains 50 at % to 98 at % of Ir, 1.0 at % to 49 at % in total of O and N, and 1.0 at % to 49 at % in total of the second element X2.

4. The reflective mask blank according to claim 3, wherein the phase shift film contains 60 at % to 89 at % of Ir, 1.0 at % to 10 at % in total of O and N, and 10 at % to 30 at % in total of the second element X2, or contains 60 at % to 85 at % of Ir, 10 at % to 30 at % in total of O and N, and 5.0 at % to 20 at % in total of the second element X2.

5. The reflective mask blank according to claim 3, wherein the phase shift film contains 1.0 at % to 45 at % in total of O and N, or 5.0 at % to 49 at % in total of the second element X2.

6. The reflective mask blank according to claim 3, wherein in the phase shift film, when the second element X2 is Ta, a ratio (Ir/Ta) of an Ir content (at %) to a Ta content (at %) is 1 to 190.

7. The reflective mask blank according to claim 3, wherein in the phase shift film, when the second element X2 is Cr, a ratio (Ir/Cr) of an Ir content (at %) to a Cr content (at %) is 1 to 105.

8. The reflective mask blank according to claim 1, wherein in the phase shift film, a ratio (Ir/N) of an Ir content (at %) to an N content (at %) is 10 to 70.

9. The reflective mask blank according to claim 1, wherein in the phase shift film, a ratio (Ir/(O+N)) of an Ir content (at %) to a sum of an O content (at %) and an N content (at %) is 4 to 17.

10. The reflective mask blank according to claim 1, wherein an extinction coefficient k of the phase shift film to the EUV light is 0.034 or more.

11. The reflective mask blank according to claim 1, wherein a full width at half maximum of a peak of the phase shift film having a highest intensity in a range of 2θ of 35 degrees to 60 degrees by the XRD method with the CuKα ray is 1.2 degrees or more.

12. The reflective mask blank according to claim 1, wherein a film thickness of the phase shift film is 20 nm or more and 60 nm or less.

13. The reflective mask blank according to claim 1, wherein the protection film contains at least one element selected from Ru, Rh, and Si.

14. The reflective mask blank according to claim 1, further comprising
an etching mask film on a side opposite to the protection film with respect to the phase shift film,
wherein the etching mask film contains at least one element selected from Al, Hf, Y, Cr, Nb, Ti, Mo, Ta, and Si.

15. The reflective mask blank according to claim 14, wherein the etching mask film further contains at least one element selected from O, N, and B.

16. The reflective mask blank according to claim 1, wherein the refractive index n of the phase shift film to the EUV light is 0.918 or less.

17. The reflective mask blank according to claim 1, wherein when a grayscale image is obtained by imaging a cross section of the phase shift film with a scanning transmission electron microscope (STEM) and a brightness profile of the grayscale image is created, skewness (Rsk) of the brightness profile is negative.

18. A reflective mask comprising the reflective mask blank according to claim 1, wherein the phase shift film includes an opening pattern.

* * * * *